United States Patent
Ohba

(10) Patent No.: US 9,721,654 B1
(45) Date of Patent: Aug. 1, 2017

(54) MEMORY DEVICE

(71) Applicant: KABUSHIKI KAISHA TOSHIBA, Tokyo (JP)

(72) Inventor: Ryuji Ohba, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/267,925

(22) Filed: Sep. 16, 2016

Related U.S. Application Data

(60) Provisional application No. 62/310,293, filed on Mar. 18, 2016.

(51) Int. Cl.
*G11C 11/00* (2006.01)
*G11C 13/00* (2006.01)
*H01L 45/00* (2006.01)

(52) U.S. Cl.
CPC ........ *G11C 13/0007* (2013.01); *G11C 13/004* (2013.01); *G11C 13/0069* (2013.01); *G11C 13/0097* (2013.01); *H01L 45/08* (2013.01); *H01L 45/1246* (2013.01); *H01L 45/146* (2013.01); *G11C 2013/0045* (2013.01); *G11C 2013/0078* (2013.01); *G11C 2213/11* (2013.01); *G11C 2213/32* (2013.01); *G11C 2213/54* (2013.01)

(58) Field of Classification Search
CPC .............. G11C 13/0007; G11C 13/004; G11C 13/0069; G11C 13/0097; H01L 45/08; H01L 45/146
See application file for complete search history.

(56) References Cited

U.S. PATENT DOCUMENTS

| | | | |
|---|---|---|---|
| 8,587,050 B2 * | 11/2013 | Ohba | B82Y 10/00 257/315 |
| 8,969,843 B2 | 3/2015 | Ohba | |
| 9,061,898 B2 | 6/2015 | Ohba | |
| 2012/0061746 A1 * | 3/2012 | Ohba | B82Y 10/00 257/325 |
| 2012/0235223 A1 * | 9/2012 | Ohba | B82Y 10/00 257/324 |
| 2013/0082319 A1 | 4/2013 | Ohba | |
| 2014/0213032 A1 * | 7/2014 | Kai | H01L 45/04 438/382 |
| 2014/0231740 A1 | 8/2014 | Ohba | |

* cited by examiner

*Primary Examiner* — Toan Le
(74) *Attorney, Agent, or Firm* — Foley & Lardner LLP

(57) ABSTRACT

A memory device according to one embodiment includes a first interconnection, a second interconnection, a charge storage portion provided between the first interconnection and the second interconnection, a tunnel film provided between the first interconnection and the charge storage portion, and a block film. the charge storage portion is capable of accumulating an electron. The tunnel film includes a fine particulate layer that including conductive fine particulates satisfying the Coulomb blockade condition, a first tunnel insulating layer provided between the first interconnection and the fine particulate layer, and a second tunnel insulating layer provided between the fine particulate layer and the charge storage portion. The block film is provided between the charge storage portion and the second interconnection. The block film has an energy structure in which no concave portion with an energy barrier lower than energy barriers on both sides thereof is present.

20 Claims, 21 Drawing Sheets

HRS (Charge stored)

LRS (Charge erased)

MEMORY DEVICE

CROSS-REFERENCE TO RELATED APPLICATIONS

This application is based upon and claims the benefit of priority from U.S. Provisional Patent Application 62/310,293, filed on Mar. 18, 2016; the entire contents of which are incorporated herein by reference.

FIELD

Embodiments relate to a memory device.

BACKGROUND

In recent years, resistance random access memory (ReRAM) devices that store data by varying the resistance values of memory elements have been proposed. Several methods have been proposed for varying the resistance values of memory elements. One of these methods is to accumulate electrons in a metal layer sandwiched between insulating films to vary the energy of the metal layer, thereby varying the quantity of the tunnel current. This method poses the problem of minimizing erroneous writing during reading while maintaining the data retention characteristics.

BRIEF DESCRIPTION OF THE DRAWINGS

FIG. 6A shows a low-resistance state, and FIG. 6B shows a high-resistance state;

FIG. 11A shows the low-resistance state, and FIG. 11B shows the high-resistance state;

FIG. 15A shows a low-resistance state, and FIG. 15B shows a high-resistance state;

FIG. 19A shows a low-resistance state, and FIG. 19B shows a high-resistance state;

DETAILED DESCRIPTION

A memory device according to one embodiment includes a first interconnection, a second interconnection, a charge storage portion provided between the first interconnection and the second interconnection, a tunnel film provided between the first interconnection and the charge storage portion, and a block film. The charge storage portion is capable of accumulating an electron. The tunnel film includes a fine particulate layer that including conductive fine particulates satisfying the Coulomb blockade condition, a first tunnel insulating layer provided between the first interconnection and the fine particulate layer, and a second tunnel insulating layer provided between the fine particulate layer and the charge storage portion. The block film is provided between the charge storage portion and the second interconnection. The block film has an energy structure in which no concave portion with an energy barrier lower than energy barriers on both sides thereof is present.

First Embodiment

A first embodiment will be described.

Figure 1:
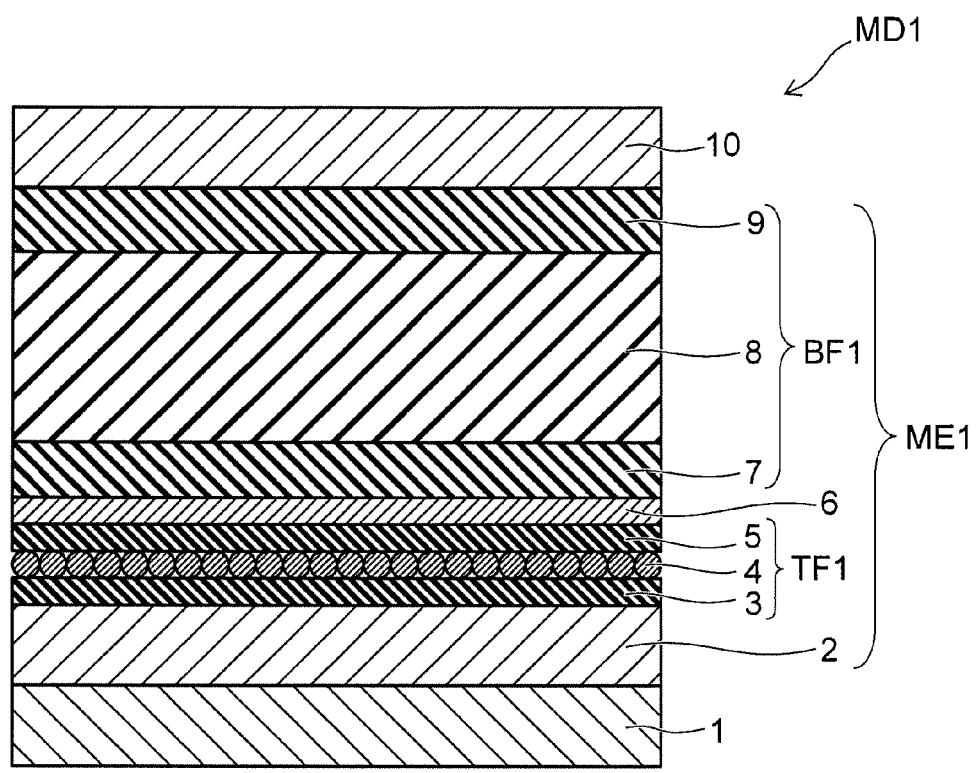
FIG. 1 is a cross-sectional view illustrating a memory device according to a first embodiment.

FIG. 1 is a cross-sectional view illustrating a memory device according to the embodiment.

Figure 2:
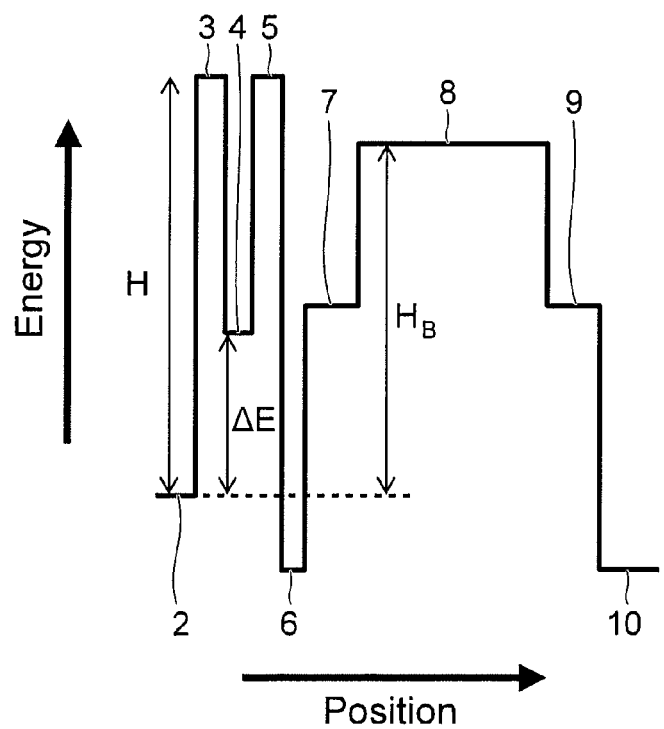
FIG. 2 is an energy structure diagram for the memory device according to the first embodiment.

FIG. 2 is an energy structure diagram for the memory device according to the embodiment.

As illustrated in FIG. 1, in a memory device MD1 according to the embodiment, a pillar-shaped memory element ME1 is provided between metal interconnection 1 and metal interconnection 10, for example. The metal interconnection 1 and 10 are formed from metal such as tungsten. In the memory element ME1, a writing assist silicon layer 2 having a thickness of, for example, 3 nanometers (nm), an interconnection-side tunnel oxide film 3 having a thickness of, for example, 1 nm, a silicon microcrystal layer 4 having a thickness of, for example, 1.5 nm, an accumulation-side tunnel oxide film 5 having a thickness of, for example, 1 nm, a metal accumulation part 6 formed by a continuous film that is made from ruthenium (Ru) and has a thickness of, for example, 0.1 nm, a hafnium oxide (HfO$_x$) layer 7 having a thickness of, for example, 2 nm, an aluminum oxide (AlO$_x$) layer 8 having a thickness of, for example, 7 nm, and a hafnium oxide layer 9 having a thickness of, for example, 2 nm are stacked from the metal interconnection 1 toward the metal interconnection 10.

The silicon microcrystal layer 4 includes a plurality of silicon (Si) microcrystals. The grain size of the microcrystals is about the same as the thickness of the silicon microcrystal layer 4, which is, for example, about 1.5 nm. A tunnel film TF1 is formed by the interconnection-side tunnel oxide film 3, the silicon microcrystal layer 4, and the accumulation-side tunnel oxide film 5. A block film BF1 is formed by the hafnium oxide layer 7, the aluminum oxide layer 8, and the hafnium oxide layer 9.

As illustrated in FIG. 2, the metal accumulation part 6 and the metal interconnection 10 are formed from metal, so their energy is low. The energy of the writing assist silicon layer 2 corresponds to the energy of the silicon conduction band edge and is higher than the energy of the Fermi surface of normal metal, resulting in the energy of the writing assist silicon layer 2 being ranked between the energy of the metal interconnection 1 and the energy of the interconnection-side tunnel oxide film 3. This configuration allows, during the writing operation, the electrons in the metal interconnection 1 to easily move to the interconnection-side tunnel oxide film 3. The interconnection-side tunnel oxide film 3 and the accumulation-side tunnel oxide film 5 are formed from silicon oxide, so their energy is higher than the energy of the writing assist silicon layer 2. Between a metal and a semiconductor with no insulating body therebetween, such as between the metal interconnection 1 and the writing assist silicon layer 2, only a Schottky barrier having low energy is present, which normally allows the electrons to enter and exit easily. When a positive voltage is applied to the metal interconnection 10 relative to the metal interconnection 1, electrons are easily supplied from the metal interconnection 1 to the conduction band of the writing assist silicon layer 2 and flow toward the interconnection-side tunnel oxide film 3. When a negative voltage is applied to the metal interconnection 10, the electrons within the conduction band of the writing assist silicon layer 2 easily move to the metal interconnection 1. Therefore, for electron's entry into or exit from the metal interconnection 1 in the memory element ME1, it is only required to consider electron's entry into or exit from the conduction band edge of the writing assist silicon layer 2.

When having one electron that has been injected from the outside in its silicon microcrystal, the silicon microcrystal layer 4 is brought into a high-energy state due to the electrostatic energy and the like. The grain size of the silicon microcrystals of the silicon microcrystal layer 4 is small at 1.5 nm, which satisfies the Coulomb blockade condition. The Coulomb blockade condition refers to the condition in which the charge energy of one electron is greater than the thermal fluctuation at room temperature (300 K), or 26 meV. Therefore, if one electron is injected into a silicon microcrystal, a high-energy state is formed by the Coulomb blockade effect and the quantum confinement effect. This configuration forms an energy barrier $\Delta E$ when an electron passes through the microcrystal of the silicon microcrystal layer 4. The smaller the grain size of the microcrystal, the higher the energy barrier $\Delta E$. In other words, controlling the thickness of the silicon microcrystal layer 4 and the heating conditions during film formation to control the grain size of the silicon microcrystals allows the magnitude of the energy barrier $\Delta E$ to be controlled.

In this way, in the memory element ME1, the silicon microcrystal layer 4 with barrier $\Delta E$ is disposed between the interconnection-side tunnel oxide film 3 and the accumulation-side tunnel oxide film 5. The energy of the silicon microcrystal layer 4 is higher than the energy of the conduction band edge of the writing assist silicon layer 2 by the amount of a single electron barrier $\Delta E$, and is normally lower than the energy of the interconnection-side tunnel oxide film 3 and the accumulation-side tunnel oxide film 5. Therefore, the energy structure of the tunnel film TF1 has a concave form. An energy region having the barrier $\Delta E$ is an energy region which prevents electron's entry thereinto including tunnel effusion, which requires electrons to energetically pass over the region. Therefore, unless a predetermined voltage is applied, substantially no electrons pass through the silicon microcrystal layer 4, which enables good memory operation. Such microscopic conductive fine particulates satisfying the Coulomb blockade condition and sandwiched between two tunnel junctions are referred to as a double tunnel junction in the field of single electron tunneling phenomena.

Each of the hafnium oxide layer 7, the aluminum oxide layer 8, and the hafnium oxide layer 9 are formed from metal oxide, so their energy is higher than the metal interconnection 10. In particular, the energy of the aluminum oxide layer 8 is higher than the energy of the hafnium oxide layers 7 and 9. Therefore, the energy structure of the block film BF1 has a convex shape.

The metal accumulation part 6 and the metal interconnection 10 have energy that is deeper than the silicon conduction band. This configuration efficiently minimizes a leakage. The energy of the metal accumulation part 6 and the energy of the metal interconnection 10 depend on the work functions of the materials from which they are formed, so the energies can be adjusted by selecting materials. In the embodiment, the energy of the metal accumulation part 6 and the energy of the metal interconnection 10 are substantially the same, but they may be different.

Next, a method for manufacturing the memory device according to the embodiment will be described.

Figure 3A:
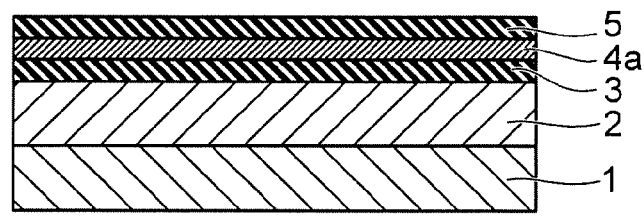
FIGS. 3A to 3C are cross-sectional views illustrating a method for manufacturing a memory device according to the first embodiment.
Figure 3B:
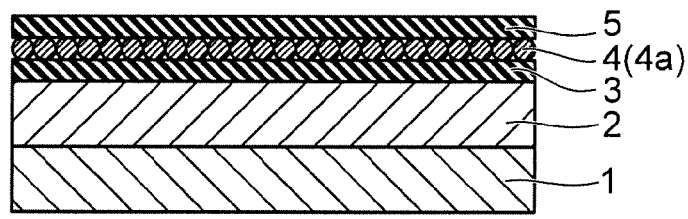
Figure 3C:
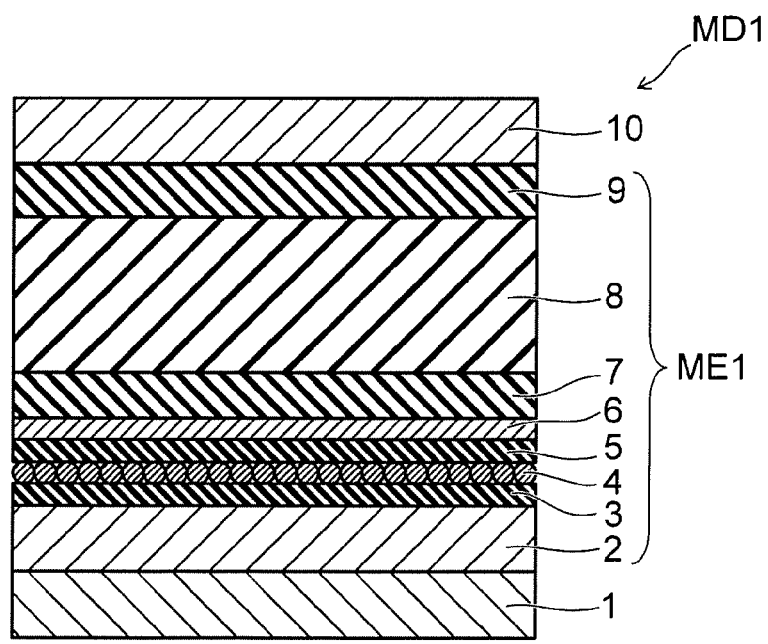

FIGS. 3A to 3C are cross-sectional views illustrating a method for manufacturing the memory device according to the embodiment.

First, as illustrated in FIG. 3A, the metal interconnection 1 is formed by tungsten deposited by, for example, a Chemical Vapor Deposition (CVD) method. Next, amorphous silicon is deposited by the CVD method to a thickness of 3.5 nm. Next, the surface of the deposited amorphous silicon is subjected to an oxidation treatment such as Rapid Thermal Oxidation (RTO) so as to be oxidized, which forms the interconnection-side tunnel oxide film 3. At this time, the remaining unoxidized amorphous silicon is crystallized to become polycrystalline silicon, which forms the writing assist silicon layer 2 with a thickness of, for example, 3 nm.

Next, amorphous silicon is deposited by, for example, the CVD method to form an amorphous silicon layer 4a with a thickness of, for example, 2 nm. Next, the surface of the amorphous silicon layer 4a is subjected to a thermal oxidation treatment so as to be oxidized, which forms the accumulation-side tunnel oxide film 5 with a thickness of, for example, 1 nm. At this stage, the thickness of the remaining unoxidized amorphous silicon layer 4a is, for example, 1.5 nm. The amorphous silicon layer 4a is sandwiched between silicon oxide films with a thickness of 1 nm in the vertical direction.

Next, as illustrated in FIG. 3B, high temperature annealing is carried out in, for example, a nitrogen atmosphere at a temperature of 900° C. This causes a group of silicon microcrystals with a size similar to the thickness of the amorphous silicon layer 4a to be formed within the amorphous silicon layer 4a, which forms the silicon microcrystal layer 4. In this process, after forming the crystals with a size similar to the thickness of the amorphous silicon layer 4a, there is a tendency for the crystalline state to be maintained with the minimum surface energy, so in a layer that is thinner than 2 nm, it is difficult for lateral crystal growth to occur. Therefore, by appropriately adjusting the nitrogen annealing conditions, the microcrystal grain size and density can be controlled so that the typical microcrystal size is about the same as the thickness of the amorphous silicon layer 4a. In this case, the typical size of the silicon microcrystals is determined by the thickness of the silicon microcrystal layer 4, which is, for example, 1.5 nm.

Next, as illustrated in FIG. 3C, ruthenium (Ru) is deposited to a thickness of 0.1 nm by, for example, a sputtering method to form the metal accumulation part 6. Metal has a large capacity for accumulating electrons, so, in the embodiment, the metal accumulation part 6 is a thin film, and the quantity of metal is small. However, for example, if there are circumstances where the quantity of electron charge should be increased, the metal accumulation part 6 may be formed thicker. Furthermore, in the embodiment, although the metal accumulation part 6 is a thin continuous film, the metal accumulation part 6 may be formed by fine metal nanodots that are discretely distributed.

Next, the hafnium oxide layer 7 with a thickness of, for example, 2 nm, the aluminum oxide layer 8 with a thickness of 7 nm, and the hafnium oxide layer 9 with a thickness of 2 nm are formed in that order by, for example, the CVD method. Immediately after each of these film forming processes, an annealing process may be carried out to improve the film quality. Next, tungsten is deposited by the CVD method or the like to form the metal interconnection 10. In this way, the memory device MD1 according to the embodiment is manufactured.

Next, the operation of the memory device according to the embodiment will be described.

Figure 4:
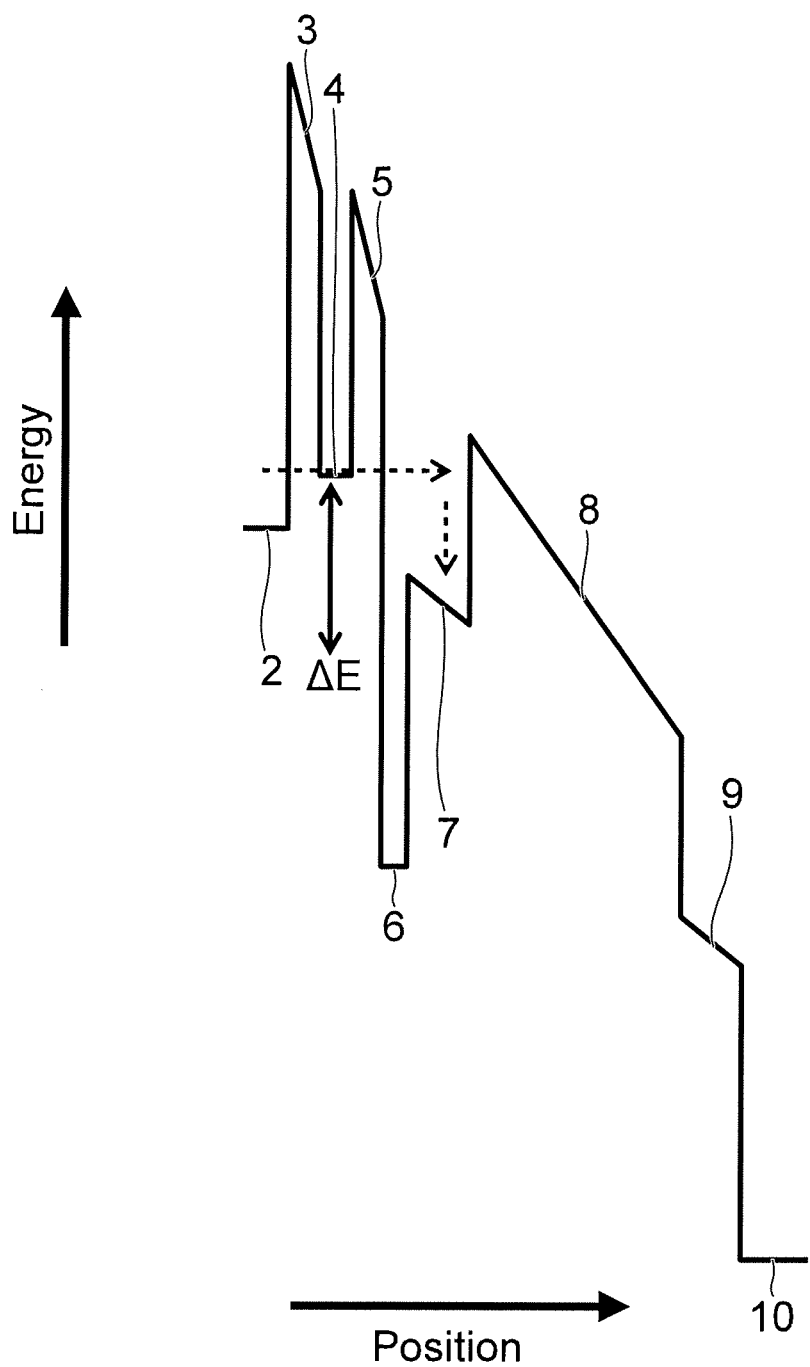
FIG. 4 is an energy structure diagram illustrating a writing operation of the memory device according to the first embodiment.

FIG. 4 is an energy structure diagram illustrating the writing operation of the memory device according to the embodiment.

Figure 5:
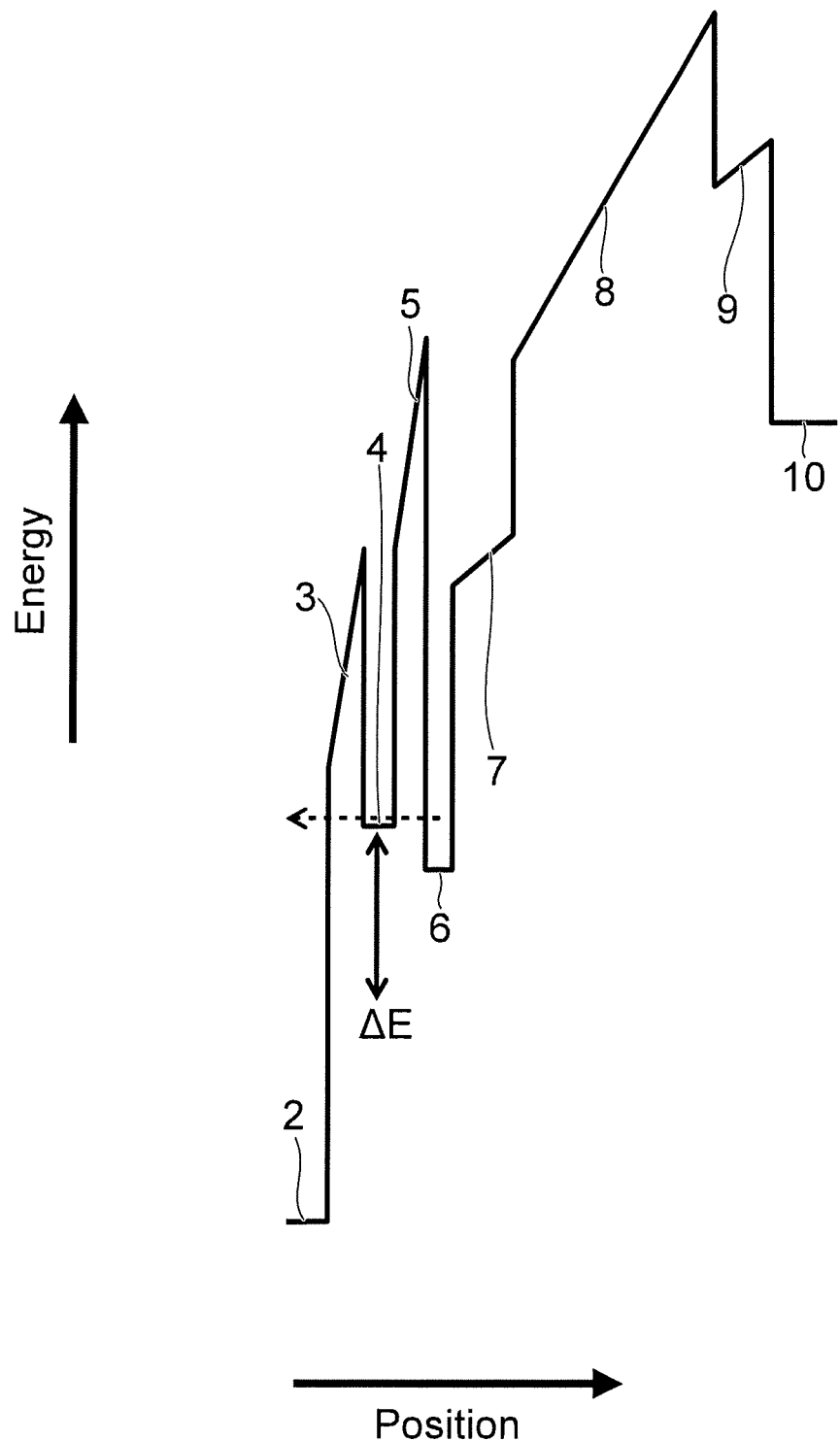
FIG. 5 is an energy structure diagram illustrating an erase operation of the memory device according to the first embodiment.

FIG. 5 is an energy structure diagram illustrating the erase operation of the memory device according to the embodiment.

Figure 6:
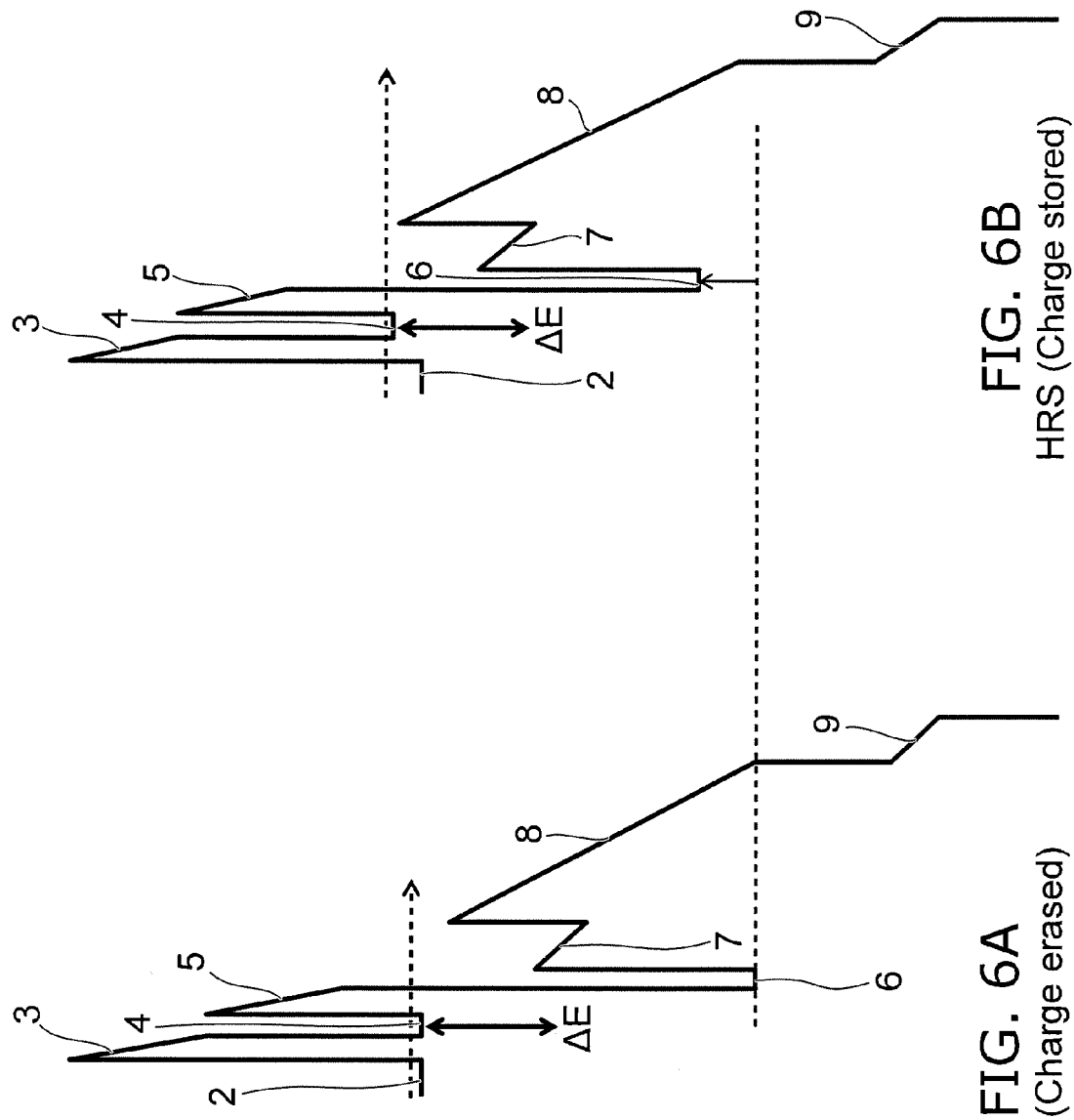
FIG. 6A and FIG. 6B are energy structure diagrams illustrating a reading operation of the memory device according to the first embodiment.

FIG. 6A and FIG. 6B are energy structure diagrams illustrating the reading operation of the memory device according to the embodiment, FIG. 6A shows the low-resistance state, and FIG. 6B shows the high-resistance state.

First, the writing process will be described.

As illustrated in FIG. 4, during the writing operation, a positive writing voltage is applied between the metal interconnection 1 and the metal interconnection 10 so that the potential of the metal interconnection 10 is higher than the potential of the metal interconnection 1. This causes electrons to be injected from the silicon conduction band edge 2 to the metal accumulation part 6 through the tunnel film TF1. In other words, applying the writing voltage causes electrons supplied from the metal interconnection 1 to move to the writing assist silicon layer 2 and to tunnel over the energy barrier $\Delta E$ from the writing assist silicon layer 2 to move into the metal accumulation part 6. The block film BF1 formed by the hafnium oxide layer 7, the aluminum oxide layer 8, and the hafnium oxide layer 9 is on the side of the metal accumulation part 6 which is remote from the tunnel film TF1, forming an energy barrier having a convex shape. Therefore, the electrons pass through the tunnel film TF1, but cannot pass through the block film BF1, so the electrons accumulate in the metal accumulation part 6. In this way, data is written.

At this time, adjusting the writing voltage value, the film thickness of the interconnection-side tunnel oxide film 3, the film thickness of the accumulation-side tunnel oxide film 5, and the height of the barrier $\Delta E$ of the silicon microcrystal layer 4 in accordance with a necessary quantity of charge to be accumulated and writing time allows the quantity of the tunnel current flowing through the tunnel film TF1 to be adjusted. As described above, the height of the barrier $\Delta E$ can be adjusted with the grain size of the silicon.

For the writing operation, only a small quantity of electrons need to be injected into the metal accumulation part 6, so a large current is not necessarily required. In the embodiment, the thicknesses of the interconnection-side tunnel oxide film 3 and the accumulation-side tunnel oxide film 5 are each extremely thin at 1 nm. Thus, even when the barrier $\Delta E$ is higher than the silicon conduction band edge, in other words, higher than the energy of the writing assist silicon layer 2, the electron current flows through the tunnel film TF1, and data can be written to the memory element ME1, In the embodiment, the electrons passing over the barrier $\Delta E$ during the writing operation are blocked by the aluminum oxide layer 8 which is the highest energy barrier in the block film BF1, so the writing efficiency is high. The writing efficiency can be controlled by adjusting the writing voltage value, the barrier $\Delta E$ height, and the thicknesses of the accumulation-side tunnel oxide film 5 and the hafnium oxide layer 7.

The electrons accumulated in the metal accumulation part 6 are retained within the metal accumulation part 6 by the energy barriers of the tunnel film TF1 and the block film BF1. On the tunnel film TF1 side, the energy of the silicon microcrystal layer 4 can minimize the leakage. On the block film BF1 side, forming the block film BF1 having the high dielectric constant due to having a large physical thickness can minimize the leakage. In the embodiment, as seen from the silicon microcrystal layer 4, the silicon microcrystal layer 4 is provided only on the tunnel film TF1 side, so the degree of freedom of the energy barrier $\Delta E$ of the silicon microcrystal layer 4 is high, which allows the barrier $\Delta E$ to be set sufficiently high. As a result, the memory element ME1 has high memory retention characteristics.

Next, the erase operation will be described.

As illustrated in FIG. 5, during the erase operation, a negative erase voltage is applied between the metal interconnection 1 and the metal interconnection 10 so that the potential of the metal interconnection 1 is higher than the potential of the metal interconnection 10. This causes the electrons accumulated in the metal accumulation part 6 to tunnel over the energy barrier $\Delta E$ of the silicon microcrystal layer 4 and to be discharged to the metal interconnection 1 through the silicon conduction band 2. At this time, adjusting the erase voltage value, the film thickness of the interconnection-side tunnel oxide film 3, the film thickness of the accumulation-side tunnel oxide film 5, and the height of the barrier $\Delta E$ in accordance with the necessary quantity of charge to be accumulated and the erase time allows the quantity of the erase tunnel current to be adjusted. At this time, the back tunnel current flowing from the metal interconnection 10 to the metal accumulation part 6 is suppressed because a high barrier is formed by the block film BF1 with a large physical film thickness and by the depth of the work function of the metal interconnection 10.

Next, the reading operation will be described.

The data written to the memory element ME1 can be read by detecting the through current which varies depending on the presence or absence of electrons accumulated in the metal accumulation part 6. When electrons are accumulated in the metal accumulation part 6, the energy of the electrons is increased compared with when electrons are not accumulated. With a constant positive reading voltage applied, if the energy of the metal accumulation part 6 is high, the potential difference applied to the tunnel film TF1 is reduced, and the energy of the silicon microcrystal layer 4 is increased. As a result, the tunnel current flowing through the tunnel film TF1 is reduced. Therefore, the state in which electrons are not accumulated in the metal accumulation part 6 is a low-resistance state (LRS), and the state in which electrons are accumulated in the metal accumulation part 6 is a high-resistance state (HRS). Note that it is preferable that the through current can be detected at high speed with a sense amplifier and that the through current be a large current in the LRS. The operation during the reading operation will be described in detail below.

As illustrated in FIG. 6A, in the LRS, electrons are not accumulated in the metal accumulation part 6, and the energy of the metal accumulation part 6 is low. In this state, a reading voltage of the same polarity as the writing voltage but with a higher positive value than the writing voltage is applied between the metal interconnection 1 and the metal interconnection 10, and electrons from the silicon conduction band edge, in other words, from the energy of the writing assist silicon layer 2, pass through the tunnel film TF1 without being affected by the energy barrier $\Delta E$. In this way, the current passing through the tunnel film TF1 is limited only by the tunnel effect of the interconnection-side tunnel oxide film 3 and the accumulation-side tunnel oxide film 5, which allows a large reading current to flow. The quantity of reading tunnel current in the LRS can be controlled by adjusting the reading voltage value, the thickness of the interconnection-side tunnel oxide film 3, the height of the barrier $\Delta E$, and the thickness of the accumulation-side tunnel oxide film 5.

In the reading operation, electrons that pass over the barrier $\Delta E$ of the silicon microcrystal layer 4 are not blocked by the aluminum oxide layer 8, which is the highest energy barrier in the block film BF1, so the electrons that has flowed as tunnel current from the metal interconnection 1 through the block film BF1 and have passed through the metal accumulation part 6 reach the metal interconnection 10 as a ballistic current, without being substantially scattered by the block film BF1. This minimizes the accumulation in the metal accumulation part 6 of electrons caused by the electrons being scattered by the block film BF1, which prevents almost all erroneous writing caused by the reading operation. Note that assuming that erroneous writing occurs in the LRS, in other words, in the state in which no electrons have been accumulated in the metal accumulation part 6, the data value would be changed.

In the embodiment, forming the energy structure of the block film BF1 into a convex shape in which no recess portion with energy lower than energy of both sides thereof is present, causes the aluminum oxide layer 8 to be isolated from the metal accumulation part 6. This configuration allows, when a positive reading voltage is applied to both ends of the memory element ME1, the energy of the aluminum oxide layer 8 to be greatly lowered so as to be lower than the energy of the silicon microcrystal layer 4. This can prevent the electrons that have passed over the barrier $\Delta E$ of the silicon microcrystal layer 4 from being blocked by the energy barrier of the aluminum oxide layer 8. As a result, the reading current in the LRS can pass with no barrier due to the block film BF1, which minimizes erroneous writing. In other words, the degree of freedom of design and operation can be increased while reducing erroneous writing.

As illustrated in FIG. 6B, in the high-resistance state (HRS), electrons have been accumulated in the metal accumulation part 6, so the energy of the metal accumulation part 6 is high. Even when the above-described reading voltage is applied in this state, the potential difference applied to the tunnel film TF1 is reduced by the amount by which the energy of the metal accumulation part 6 is higher than in the LRS, and the energy of the silicon microcrystal layer 4 is also high. A configuration is made so that the electrons injected from the writing assist silicon layer 2 are blocked by the energy barrier $\Delta E$ of the silicon microcrystal layer 4, which significantly reduces the through current passing through the tunnel film TF1 compared with in the LRS. As a result, the ratio of the reading current in the LRS to the reading current in the HRS is extremely large, so the reading accuracy is improved. The quantity of reading tunnel current in the HRS can be controlled by adjusting the reading voltage value, the thickness of the interconnection-side tunnel oxide film 3, the height of the barrier $\Delta E$ of the silicon microcrystal layer 4, the thickness of the accumulation-side tunnel oxide film 5, and the quantity of electrons accumulated in the metal accumulation part 6.

For the reading operation in the HRS, a configuration is made so that the electrons that have passed over the barrier $\Delta E$ are not blocked by the aluminum oxide layer 8 which is the highest energy barrier in the block film BF1, in the same way as in the LRS, which desirably prevents excessive writing. Whether or not the electrons are blocked by the aluminum oxide layer 8 can be controlled by adjusting the reading voltage value, the height of the barrier $\Delta E$, the thickness of the accumulation-side tunnel oxide film 5, the thickness of the hafnium oxide layer 7, and quantity of accumulated charge. In the embodiment, forming the energy structure of the block film BF1 into a convex shape in which no recess portion with energy lower than energy of both sides thereof is present, allows the reading current in the HRS to pass with no barrier due to the block film BF1, which can minimize erroneous writing.

However, it is considered that excessive writing in the HRS, in other words, in the state in which electrons have been accumulated in the metal accumulation part 6 is not as fatal as in the LRS described above, in other words, in the state in which no electrons have been accumulated in the metal accumulation part 6. This is because the data value is not changed; with the metal accumulation part 6 saturated with a certain quantity of electrons, further electrons are not accumulated; and the erase operation allows the original state to be restored.

Next, effects of the embodiment will be described.

With the memory device according to the embodiment, the height of the barrier ΔE can be controlled by controlling the grain size of the silicon microcrystals in the silicon microcrystal layer 4. Furthermore, the energy structure can be determined by the materials and thicknesses of the interconnection-side tunnel oxide film 3, the accumulation-side tunnel oxide film 5, the metal accumulation part 6, the hafnium oxide layer 7, the aluminum oxide layer 8, and the hafnium oxide layer 9. With the memory element ME1 according to the embodiment, this configuration allows each operating voltage and the current value in each state to be determined on the basis of the structure factors. Therefore, for example, stable characteristic design and operation design can be made, without depending on phenomena that are difficult to control, such as forming conductive filaments within a metal oxide.

Furthermore, according to the embodiment, only the silicon microcrystal layer 4 is provided on the tunnel film TF1 side, so the energy setting range of the silicon microcrystal layer 4 is wide, which makes the degree of freedom of design high. This configuration can make the barrier ΔE sufficiently high, which makes the data retention characteristics good. Furthermore, forming the energy structure of the block film BF1 into a convex shape with no concave structure in which energy of the middle portion is lower than energy of both sides, allows the block film BF1 to prevent electrons from being scattered during the reading operation, which can minimize erroneous writing. Accordingly, the embodiment makes it possible to realize a two-terminal memory element with excellent memory retention characteristics and with few erroneous writing during reading.

In addition, according to the embodiment, electrons accumulated in the metal accumulation part 6 during the writing operation changes the energy structure of the tunnel film TF1 during the reading operation, which allows the reading current to greatly vary between the LRS and the HRS. Therefore, the operational stability of the memory device according to the embodiment is high. This effect will be described below.

Figure 7:
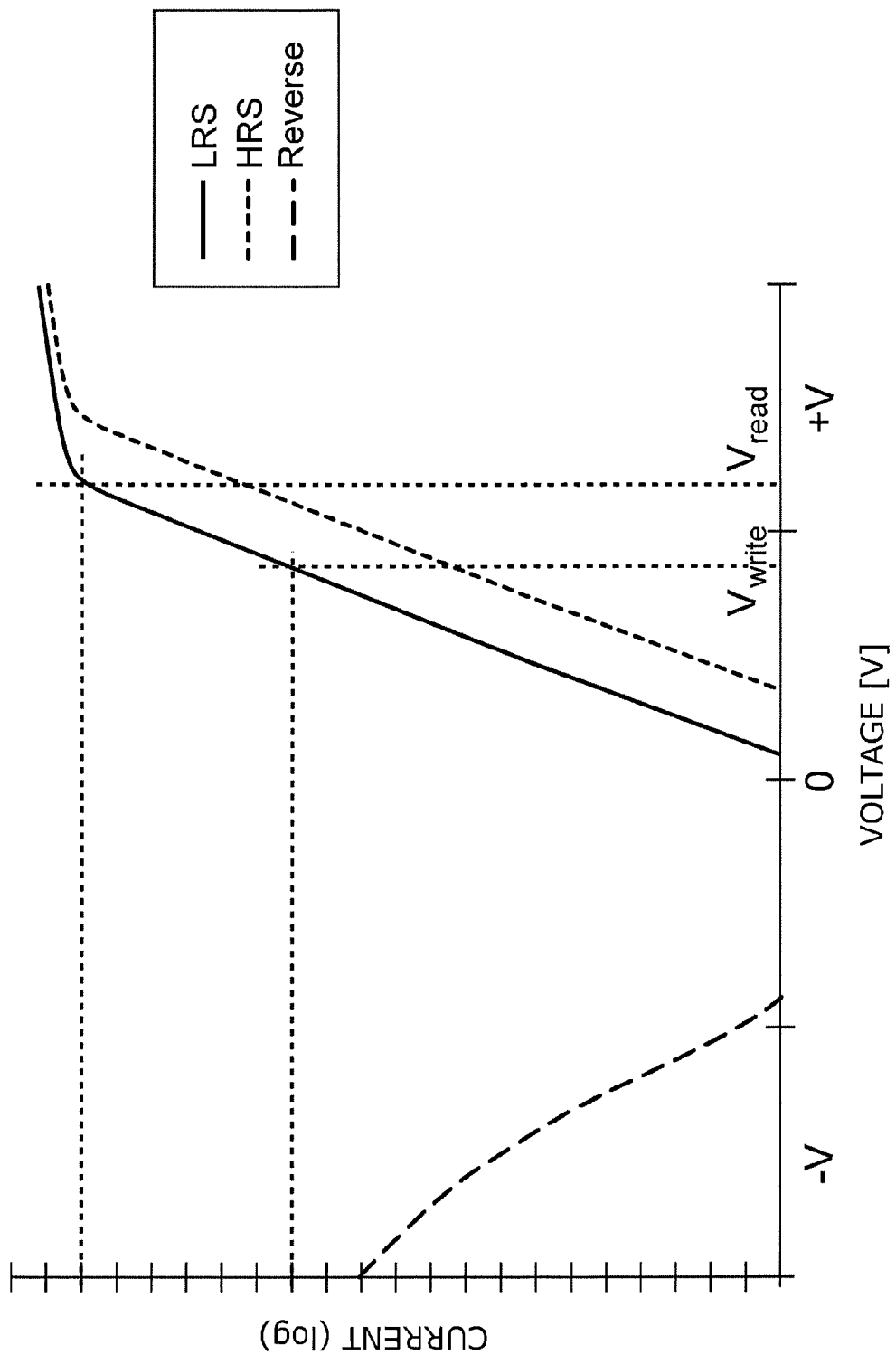
FIG. 7 is a single logarithmic graph showing the I-V characteristics of a memory element of the first embodiment, with the voltage value on the horizontal axis and the logarithm of the current value on the vertical axis.

FIG. 7 is a single logarithmic graph showing the I-V characteristics of the memory element of the embodiment, with the voltage value on the horizontal axis and the logarithm of the current value on the vertical axis.

In FIG. 7, the tunnel current that flows from the metal interconnection 1 through the tunnel film TF1 via the silicon conduction band edge 2 is denoted as "LRS" when the tunnel current flows in the low-resistance state in which electrons have not been accumulated in the metal accumulation part 6; denoted as "HRS" when the tunnel current flows in the high-resistance state in which electrons have been accumulated in the metal accumulation part 6; and denoted as "Reverse" when the tunnel current flows from the metal interconnection 10 through the block film BF1.

When a positive voltage is applied to the memory element ME1 with the metal interconnection 10 as the positive electrode and the metal interconnection 1 as the negative electrode, the electrons attempt to pass through the tunnel film TF1 from the metal interconnection 1 to the metal interconnection 10. At this time, the quantity of electrons accumulated in the metal accumulation part 6 differs between the LRS and the HRS, and the electric field applied to the tunnel film TF1 varies in proportion to the difference in quantity of electrons, so the curve indicating the I-V characteristics moves parallel in the voltage direction by the amount of the voltage difference equivalent to the difference in the quantity of accumulated electrons. The tunnel current depends on the voltage applied to the tunnel film TF1, the effective energy height and the effective thickness of the tunnel film TF1 in an exponential relationship, so when the curve representing the I-V characteristics moves parallel in the voltage direction, the tunnel current when a certain voltage is applied varies exponentially. Specifically, when the electrons accumulated in the metal accumulation part 6 are discharged, the energy of the electrons of the metal accumulation part 6 is reduced. This causes the energy of the silicon microcrystal layer 4 to be reduced as well. In other words, the state illustrated in FIG. 6B transfers to the state illustrated in FIG. 6A. As a result, as illustrated in FIG. 7, the tunnel current passing through the tunnel film TF1 increases by several orders of magnitude.

In this way, with even a small quantity of accumulated charge, the tunnel current varies greatly between the LRS and the HRS, so a variable resistance element can be realized with an excellent ON/OFF ratio. Furthermore, with a plurality of memory elements ME1 integrated, when a positive voltage, such as the reading voltage $V_{read}$ or the writing voltage $V_{write}$, is applied to a selected memory element, a positive voltage that is lower than that of the selected memory element but is not negligible may be applied to unselected memory elements, depending on the state of integration. In such a case, with the memory element ME1 according to the embodiment, the current varies exponentially with respect to the change in voltage, so a leakage current that flows through the unselected memory elements is extremely small compared with the current flowing through the selected memory element.

Furthermore, when a negative voltage is applied to the memory element ME1, electrons attempt to flow from the metal interconnection 10 toward the metal interconnection 1. However, because the metal interconnection 10 has a deep work function, the physical film thickness of the block film BF1 is large, the dielectric constant is high, and the energy barrier is high, almost no tunnel current flows. Therefore, during the erase operation, the back tunnel current can be effectively suppressed. Furthermore, when a positive voltage, such as the reading voltage $V_{read}$ or the writing voltage $V_{write}$, is applied to a selected memory element, a negative voltage may be applied to unselected memory elements depending on the state of integration of the memory elements. In this case also, the flow of current in the reverse direction through the unselected memory elements can be suppressed. In other words, the memory element ME1 has current rectification action.

Second Embodiment

Next a second embodiment will be described.

Figure 8:
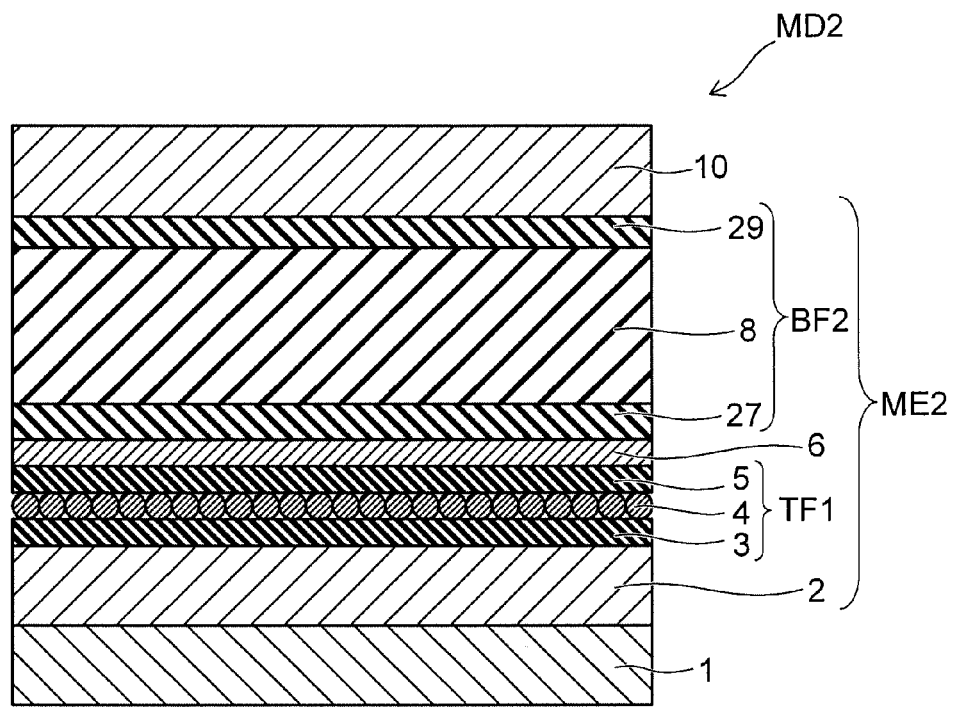
FIG. 8 is a cross-sectional view illustrating a memory device according to a second embodiment.

FIG. 8 is a cross-sectional view illustrating a memory device according to the embodiment.

Figure 9:
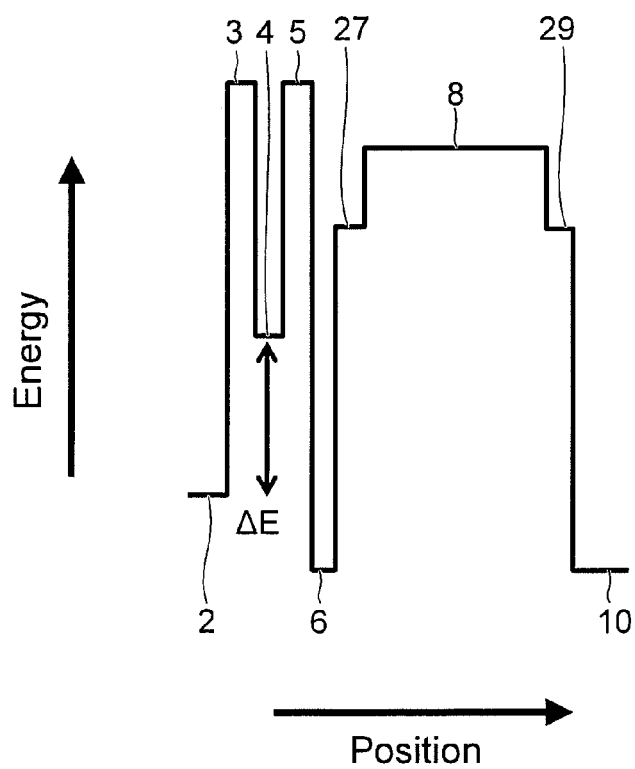
FIG. 9 is an energy structure diagram for the memory device according to the second embodiment.

FIG. 9 is an energy structure diagram for the memory device according to the embodiment.

As illustrated in FIG. 8, in a memory device MD2 according to the embodiment, the configuration of the block film is different compared with the memory element ME1 (see FIGS. 1 and 2) according to the first embodiment described above. In other words, in a block film BF2 of a memory element ME2 of the embodiment, a silicon nitride (SiN$_x$) layer 27 having a thickness of, for example, 1 nm, an aluminum oxide (AlO$_x$) layer 8 having a thickness of, for example, 7 nm, and a silicon nitride (SiN$_x$) layer 29 having a thickness of, for example, 1 nm are stacked in that order.

As illustrated in FIG. 9, the energy structure of the block film BF2 is a convex energy structure, which is the same as in the first embodiment described above. In other words, the energy of the silicon nitride layers 27 and 29 is lower than the energy of the aluminum oxide layer 8.

Next, a method for manufacturing the memory device according to the embodiment will be described.

First, the processes illustrated in FIG. 3A and FIG. 3B are carried out to form the writing assist silicon layer 2, the interconnection-side tunnel oxide film 3, the silicon microcrystal layer 4, and the accumulation-side tunnel oxide film 5 on the metal interconnection 1. The metal accumulation part 6 is formed in the same way.

Next, silicon nitride is deposited by, for example, the CVD method to a thickness of, for example, 1 nm to form the silicon nitride layer 27. Next, aluminum oxide is deposited to a thickness of, for example, 7 nm to form the aluminum oxide layer 8. Next, silicon nitride is deposited to a thickness of, for example, 1 nm to form the silicon nitride layer 29. Immediately after each of these film forming processes, an annealing process may be provided to improve the film quality. The rest of the method for manufacturing the memory device is the same as the first embodiment described above. In this way, the memory device MD2 can be manufactured.

Next, the operation of the memory device according to the embodiment will be described.

Figure 10:
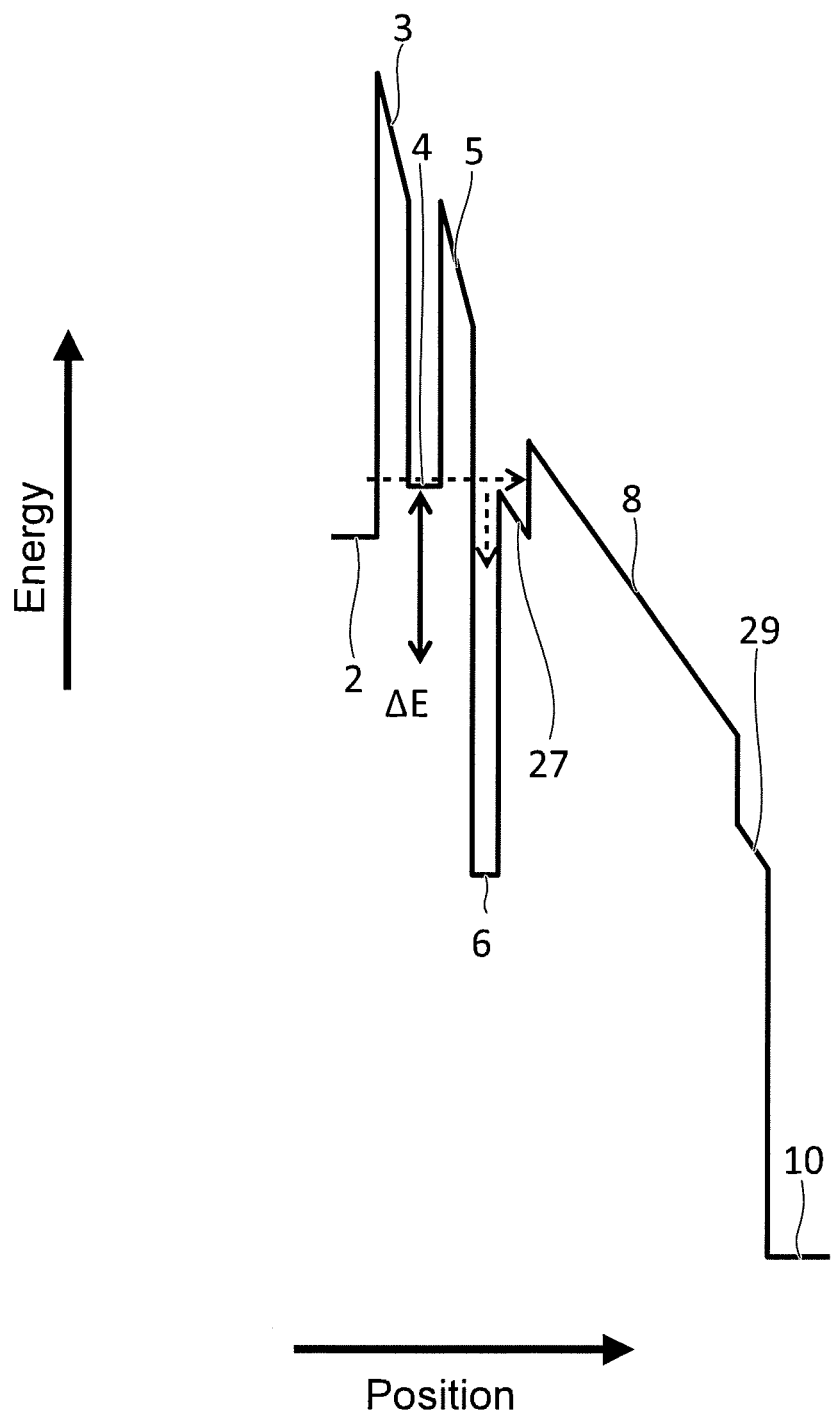
FIG. 10 is an energy structure diagram for a writing operation of the memory device according to the second embodiment.

FIG. 10 is an energy structure diagram for the writing operation of the memory device according to the embodiment.

Figure 11B:
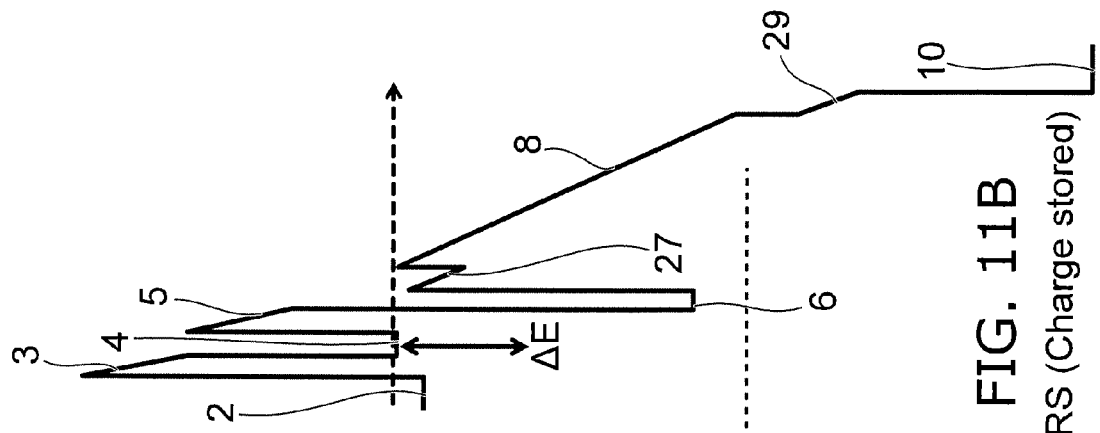
FIG. 11A and FIG. 11B are energy structure diagrams illustrating a reading operation of the memory device according to the second embodiment.
Figure 11A:
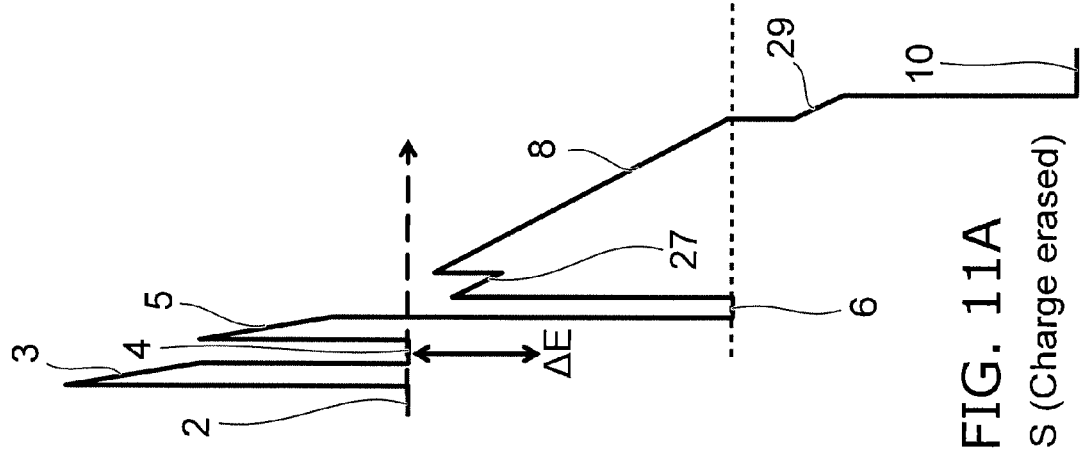

FIG. 11A and FIG. 11B are energy structure diagrams illustrating the reading operation of the memory device according to the embodiment, FIG. 11A shows the low-resistance state, and FIG. 11B shows the high-resistance state.

First, the writing process will be described.

As illustrated in FIG. 10, the writing operation is carried out by electrons from the silicon conduction band edge of the writing assist silicon layer 2 tunneling over the energy barrier ΔE of the silicon microcrystal layer 4. As in the first embodiment, a configuration is made so that the electrons passing over the barrier ΔE during the writing operation are blocked by the aluminum oxide layer 8 which is the highest energy barrier in the block film BF2, which desirably increases the writing efficiency. This state can be realized by adjusting the writing voltage value, the height of the barrier ΔE, and the thicknesses of the accumulation side tunnel oxide film 5 and the silicon nitride layer 27.

The erase operation is carried out by causing the electrons accumulated in the metal accumulation part 6 to tunnel over the energy barrier ΔE of the silicon microcrystal layer 4, which is the same as the first embodiment. The erase tunnel current can be adjusted by adjusting the erase voltage value, the thickness of the tunnel oxide film, and the height of the barrier ΔE in accordance with the necessary quantity of charge to be accumulated and erase time. The back tunnel current from the metal interconnection 10 toward the metal accumulation part 6 is minimized by the block film BF2 with a large physical film thickness and high dielectric constant and the depth of the work function of the metal interconnection 10.

Memory retention is achieved in such a manner that forming, on the tunnel film side, a high energy barrier ΔE with the silicon microcrystals prevents a leakage and a large physical film thickness and high dielectric constant on the block film side prevents a leakage. In the embodiment, the silicon microcrystal layer 4 is provided only on the tunnel film side, so the freedom to increase the energy barrier ΔE is high, and the memory retention characteristics can be increased.

The reading operation is carried out by detecting the through current which varies depending on whether or not electrons have been accumulated.

As illustrated in FIG. 11A, in the LRS, electrons from the metal accumulation part 6 have been removed, so the energy of the metal accumulation part 6 is low. At this time, when the reading voltage greater than the writing voltage is applied to cause electrons injected from the conduction band edge of the writing assist silicon layer 2 to pass through the silicon microcrystal layer 4 without being affected by the energy barrier ΔE, the current flowing through the tunnel film is in fact restricted only by the tunnel effect of the thin interconnection-side tunnel oxide film 3 and the accumulation-side tunnel oxide film 5, so a large reading current can be ensured. The quantity of reading tunnel current can be adjusted by adjusting the reading voltage value, the thickness of the tunnel oxide film, and the height of the barrier ΔE.

A configuration is made so that the electrons passing over the barrier ΔE are not blocked, during the reading operation, by the aluminum oxide layer 8 which is the highest energy barrier in the block film, which can minimize erroneous writing. This state can be realized by adjusting the reading voltage value, the height of the barrier ΔE, and the thicknesses of the accumulation-side tunnel oxide film 5 and the silicon nitride layer 27. In this way, in the second embodiment, forming the energy structure of the block film BF2 into a convex shape causes the reading current that flows through the memory element in the erased state to pass with no barrier due to the block film, which can minimize erroneous writing.

As illustrated in FIG. 11B, in the HRS, electrons have been accumulated in the metal accumulation part 6, so the energy of the metal accumulation part 6 is high. This reduces the potential difference applied to the tunnel film TF1 when the reading voltage is applied, thereby reducing the through current. A configuration is made so that the electrons injected from the conduction band edge of the writing assist silicon layer 2 are blocked by the energy barrier ΔE at this time, which greatly reduces the current value compared with the LRS and desirably increases the LRS/HRS ON/OFF ratio. This state can be realized by adjusting the reading voltage value, the thickness of the tunnel oxide film, the height of the barrier ΔE, and the quantity of charge to be accumulated.

For reading in the HRS also, a configuration is made so that the electrons passing over the barrier ΔE are not blocked by the aluminum oxide layer 8 which is the highest energy barrier in the block film BF2, which can desirably minimize excessive writing. This state can be realized by adjusting the reading voltage value, the height of the barrier ΔE, the thicknesses of the accumulation-side tunnel oxide film 5 and the silicon nitride layer 27, and the quantity of charge to be accumulated. In the embodiment, forming the energy structure of the block film BF2 into a convex shape in which no recess portion with energy lower than energy of both sides thereof is present, allows the reading current in the written state to pass with no barrier due to the block film BF1, which can minimize excessive writing. However, it is considered that excessive writing during reading when the memory element is in the written state is not as fatal as erroneous writing in the erased state described above. This is because saturation will occur at some point which prevents further writing and the original state can be restored by erasing.

As described above, in the embodiment, the silicon microcrystal layer 4 is only provided on the tunnel film side, so the silicon microcrystal layer 4 can be in a high energy state without restriction, so the memory retention characteristics are excellent. Furthermore, because the energy of the silicon nitride layers 27 and 29 is lower than the energy of the aluminum oxide layer 8, the energy structure of the block film BF2 is formed into a convex structure with no concave structure in which energy of the middle portion is lower than energy of both sides, which can minimizes erroneous writing caused by the energy barrier of the block layer during reading.

The configuration, manufacturing method, action, and effect according to the embodiment other than those described above are the same as the first embodiment described above.

Third Embodiment

Next, a third embodiment will be described.

Figure 12:
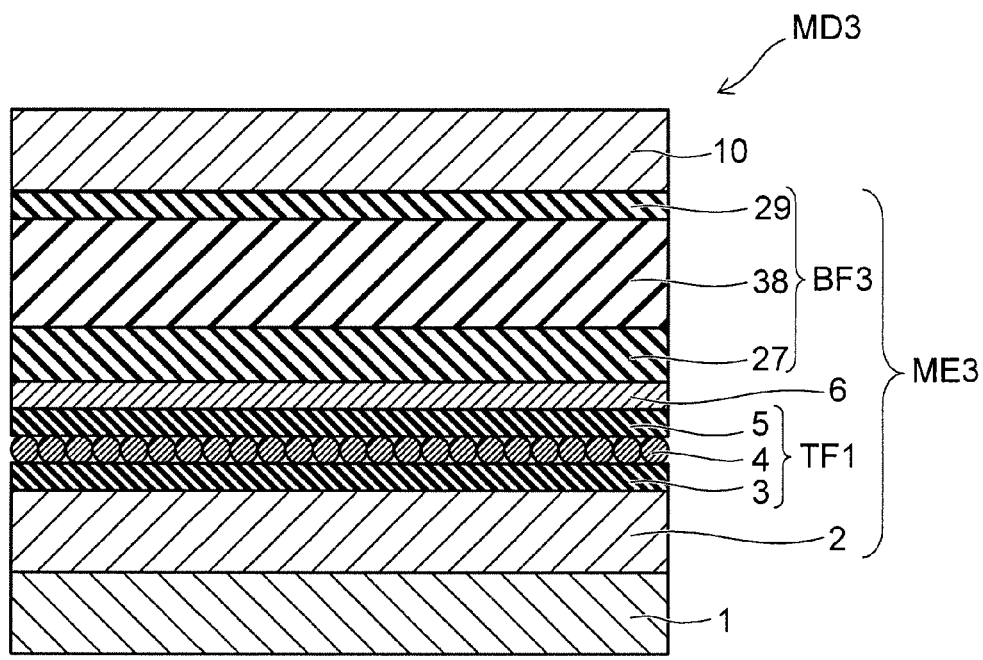
FIG. 12 is a cross-sectional view illustrating a memory device according to a third embodiment.

FIG. 12 is a cross-sectional view illustrating a memory device according to the embodiment.

Figure 13:
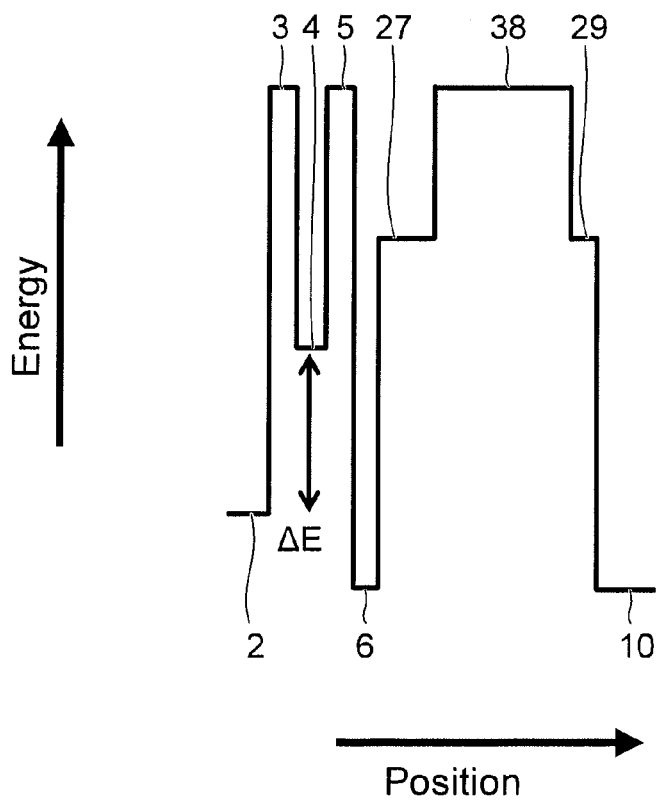
FIG. 13 is an energy structure diagram for the memory device according to the third embodiment.

FIG. 13 is an energy structure diagram for the memory device according to the embodiment.

Figure 14:
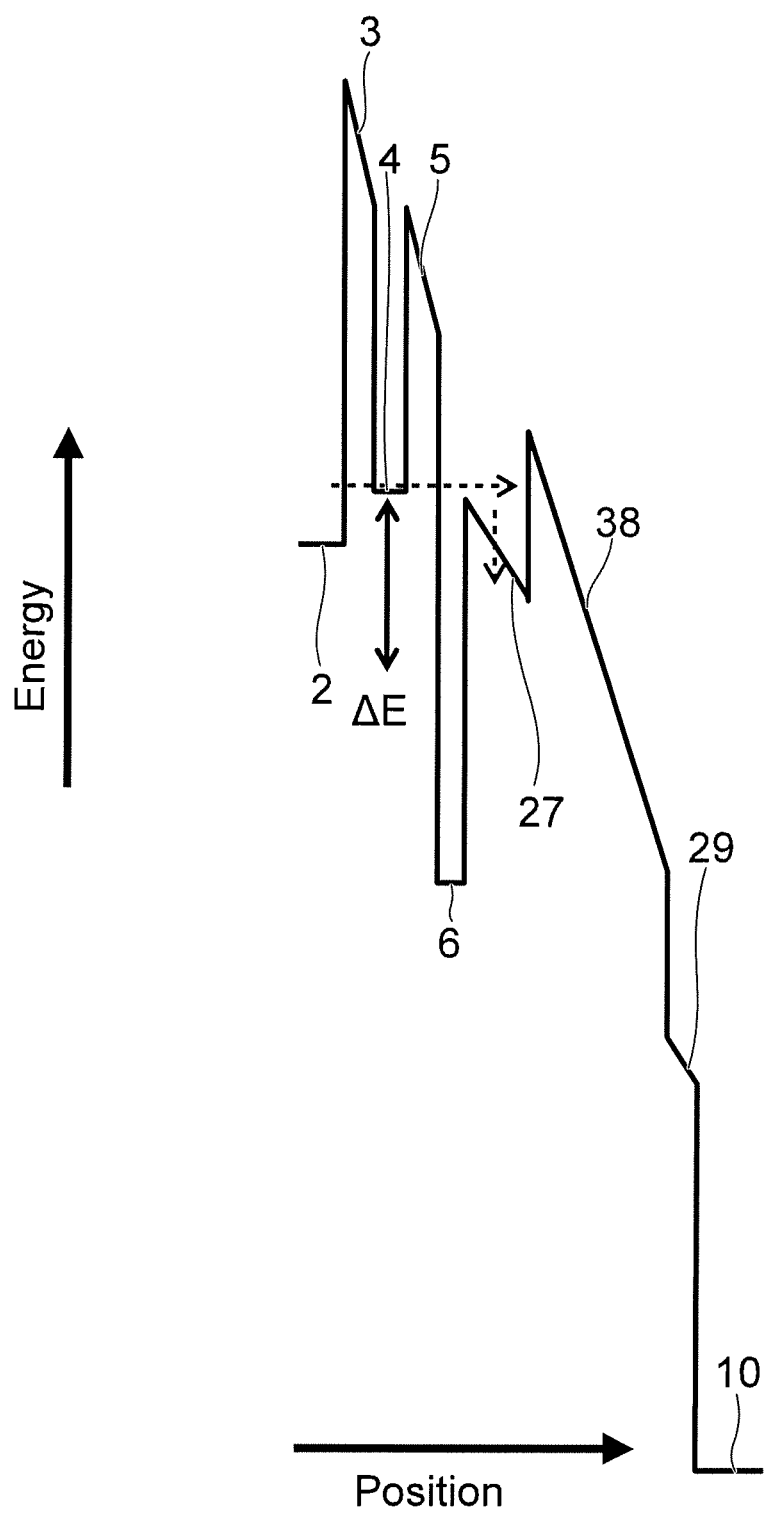
FIG. 14 is an energy structure diagram for a writing operation of the memory device according to the third embodiment.

FIG. 14 is an energy structure diagram for the writing operation of the memory device according to the embodiment.

Figure 15:
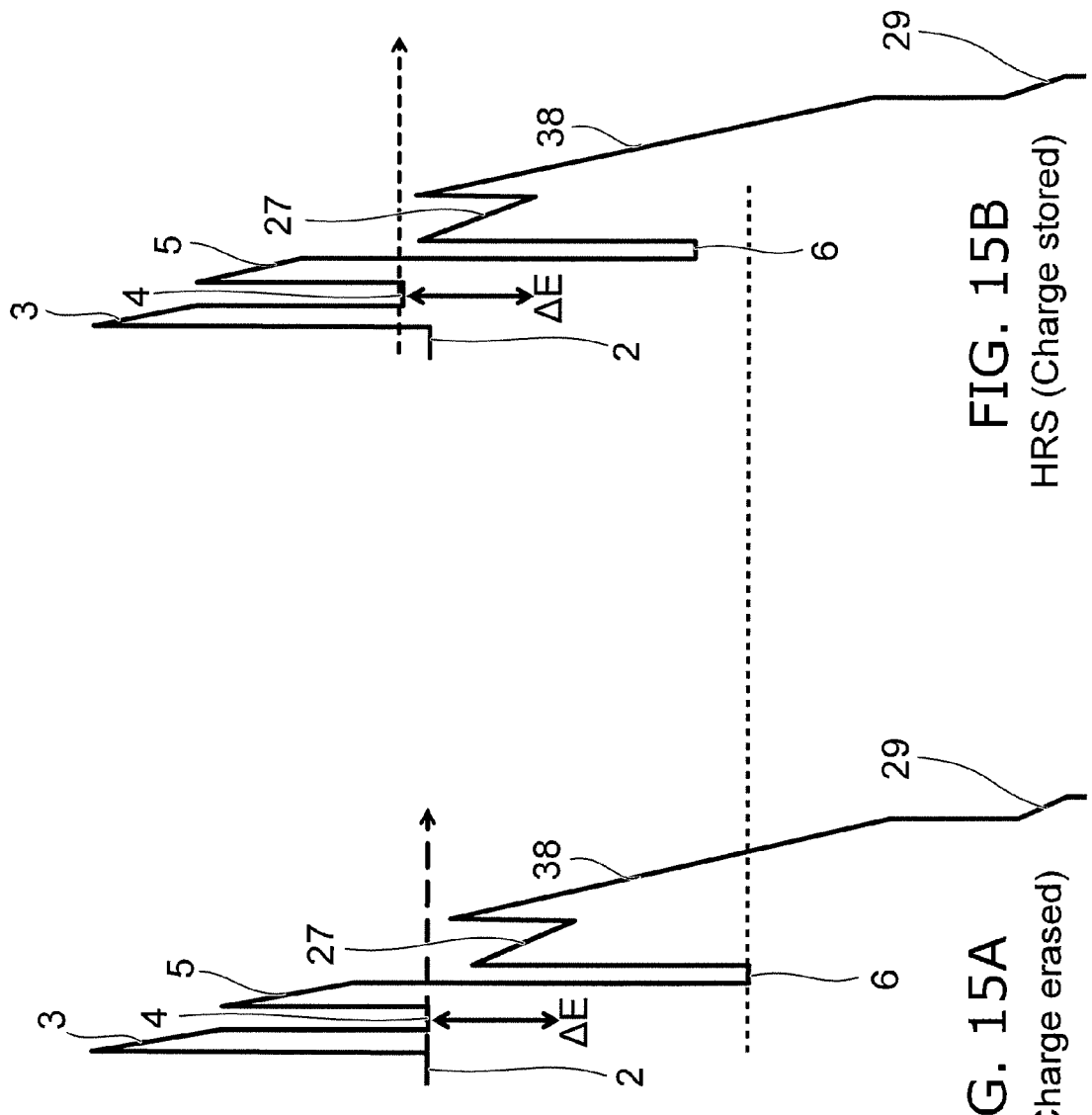
FIG. 15A and FIG. 15B are energy structure diagrams illustrating the reading operation of the memory device according to the third embodiment.

FIG. 15A and FIG. 15B are energy structure diagrams illustrating the reading operation of the memory device according to the embodiment, FIG. 15A shows the low-resistance state, and FIG. 15B shows the high-resistance state.

As illustrated in FIG. 12, in a memory device MD3 according to the embodiment, the configuration of the block film is different compared with the memory element ME2 (see FIG. 8) according to the second embodiment described above. In other words, in a block film BF3 of a memory element ME3 of the embodiment, a silicon nitride layer 27 having a thickness of, for example, 2 nm, a silicon oxide layer 38 having a thickness of, for example, 4.5 nm, and a silicon nitride layer 29 having a thickness of, for example, 1 nm are stacked in that order.

As illustrated in FIG. 13, the energy of the silicon oxide layer 38 is higher than the energy of the silicon nitride layer 27 and the energy of the silicon nitride layer 29, so the energy structure of the block film BF3 is convex.

Next, a method for manufacturing the memory device according to the embodiment will be described.

The metal interconnection 1, the writing assist silicon layer 2, the tunnel film TF1, and the metal accumulation part 6 are formed in the same way as the first embodiment. Next, the silicon nitride layer 27 with a thickness of 2 nm, the silicon oxide layer 38 with a thickness of 4.5 nm, and the silicon nitride layer 29 with a thickness of 1 nm are formed in that order by, for example, the CVD method. Immediately after each of these film forming processes, an annealing process may be carried out to improve the film quality. The rest of the method for manufacturing the memory device is the same as the first embodiment.

As illustrated in FIG. 14, FIG. 15A, and FIG. 15B, the operation and effect of the memory device according to the embodiment are the same as the first embodiment described above.

Fourth Embodiment

Next, a fourth embodiment will be described.

Figure 16:
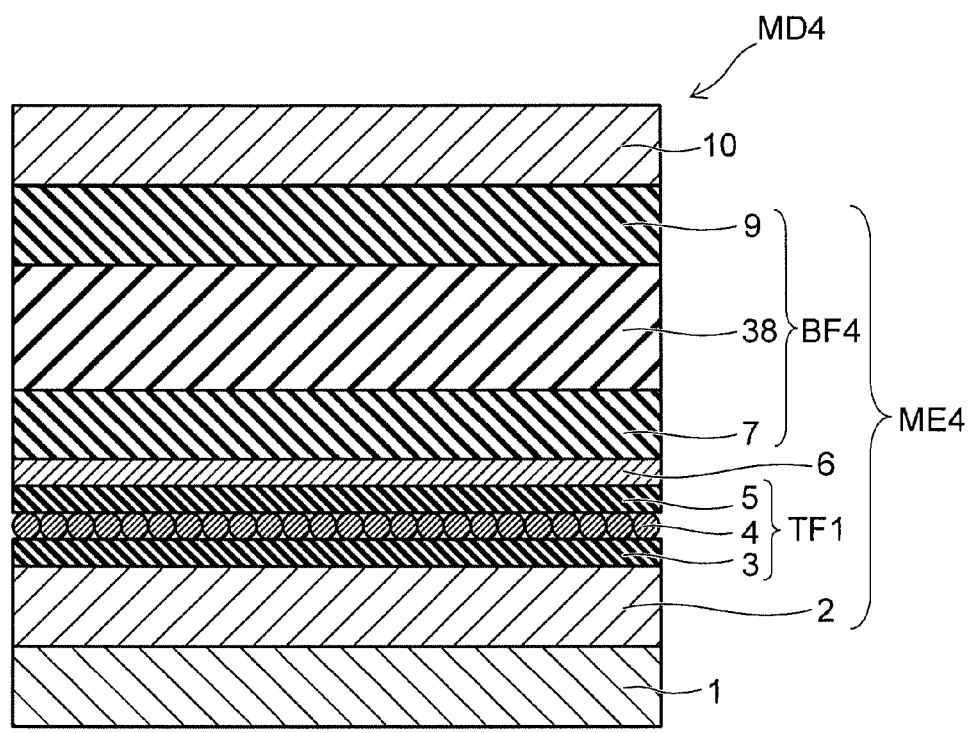
FIG. 16 is a cross-sectional view illustrating a memory device according to a fourth embodiment.

FIG. 16 is a cross-sectional view illustrating a memory device according to the embodiment.

Figure 17:
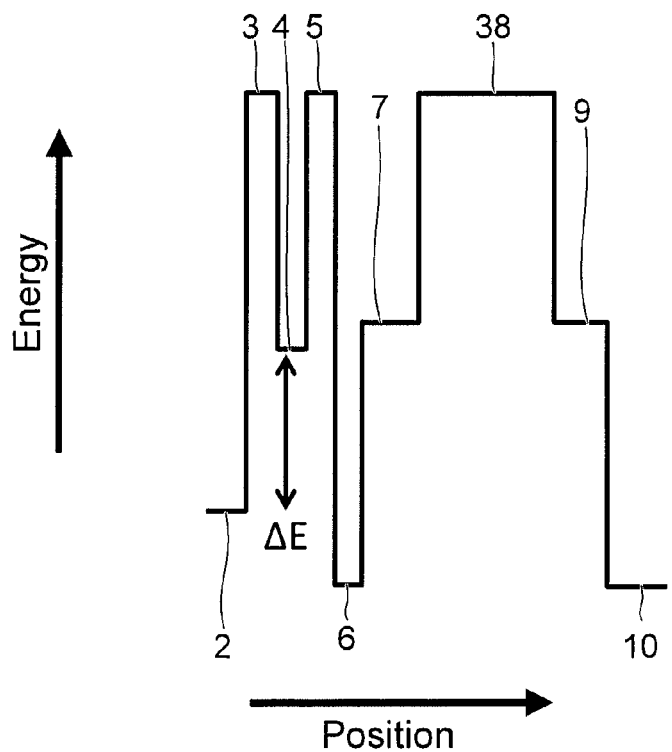
FIG. 17 is an energy structure diagram for the memory device according to the fourth embodiment.

FIG. 17 is an energy structure diagram for the memory device according to the embodiment.

Figure 18:
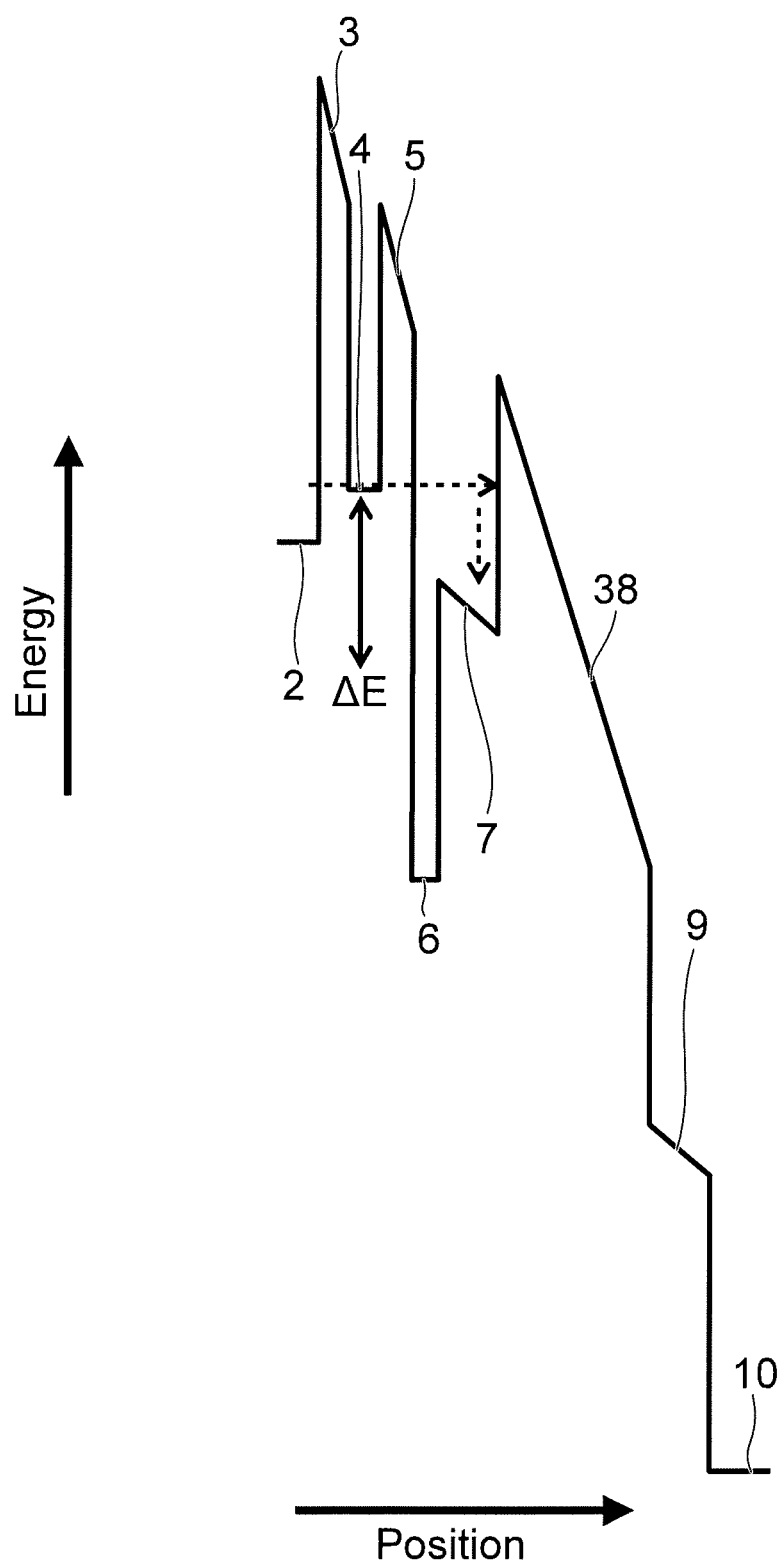
FIG. 18 is an energy structure diagram for a writing operation of the memory device according to the fourth embodiment.

FIG. 18 is an energy structure diagram for the writing operation of the memory device according to the embodiment.

Figure 19:
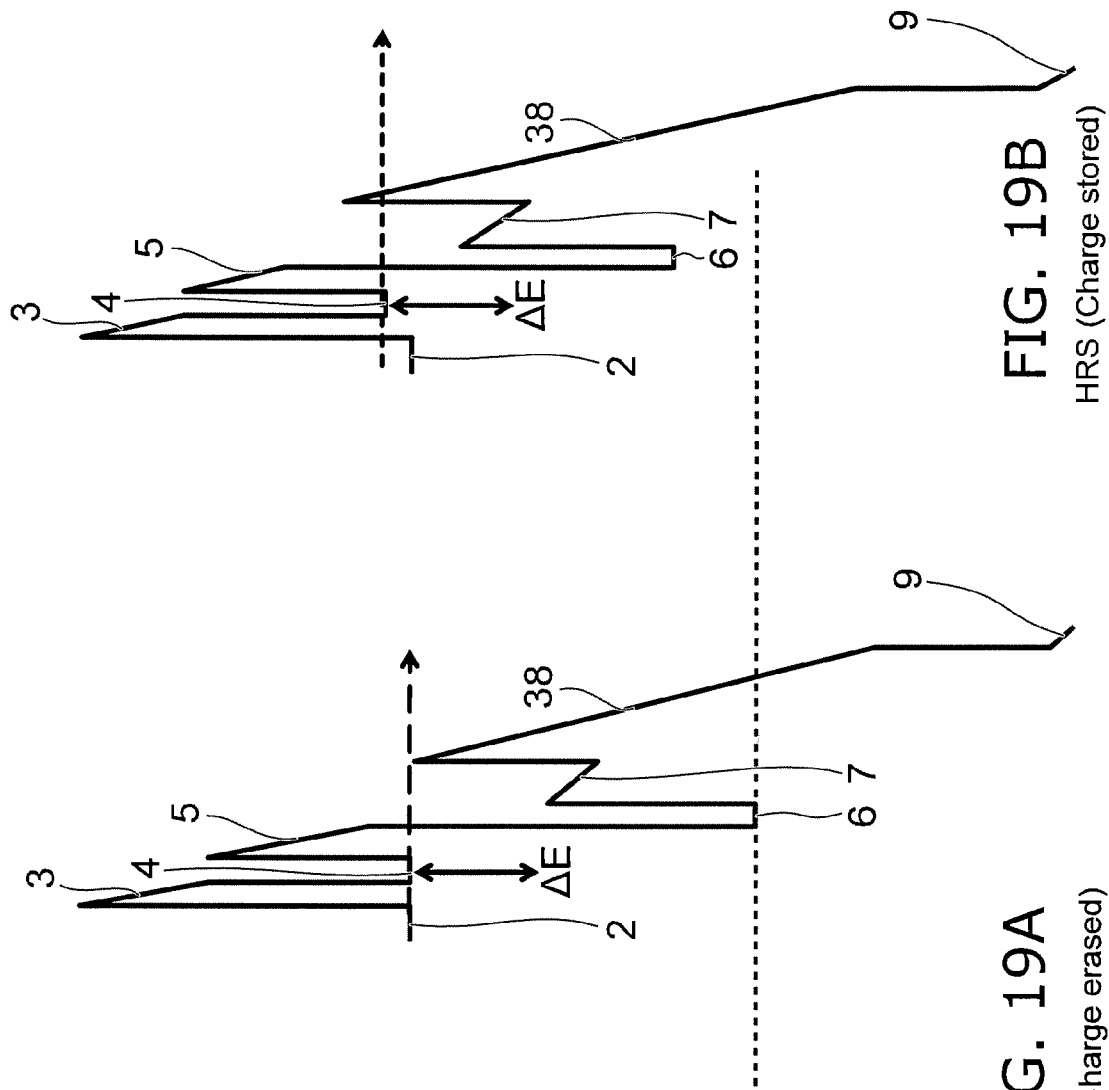
FIG. 19A and FIG. 19B are energy structure diagrams illustrating a reading operation of the memory device according to the fourth embodiment.

FIG. 19A and FIG. 19B are energy structure diagrams illustrating the reading operation of the memory device according to the embodiment, FIG. 19A shows the low-resistance state, and FIG. 19B shows the high-resistance state.

As illustrated in FIG. 16, the embodiment is an example that combines the first embodiment and the second embodiment described above. Specifically, in a block film BF4 of the memory device MD4 of the embodiment, the hafnium oxide layer 7 having a thickness of, for example, 2 nm, the silicon oxide layer 38 having a thickness of, for example, 5 nm, and the hafnium oxide layer 9 having a thickness of, for example, 2 nm are stacked in that order.

This block film BF4 can be formed by a 2 nm hafnium oxide layer 7, a 5 nm silicon oxide layer 38, and a 2 nm hafnium oxide layer 9 deposited by, for example, the CVD method, which is the same as the first embodiment. Immediately after each of these film forming processes, an annealing process may be carried out to improve the film quality.

As illustrated in FIG. 17, the energy of the silicon oxide layer 38 is higher than the energy of the hafnium oxide layer 7 and the energy of the hafnium oxide layer 9, so the energy structure of the block film BF4 is convex.

As illustrated in FIG. 18, FIG. 19A, and FIG. 19B, the operation and effect of the memory device according to the embodiment is the same as the first embodiment described above. During reading in the written state as illustrated in FIG. 19B, the memory operation is possible even though there is a certain amount of blockage by the silicon oxide film which has the highest energy barrier in the block film. Even when additional writing occurs during reading in the written state, the data value is not changed. Thus, it is not as fatal as erroneous writing in the erased state. In addition, the additional writing will cause saturation at some point and further writing will not be possible, and the original state can be restored by erasing.

Fifth Embodiment

Next, a fifth embodiment will be described.

Figure 20:
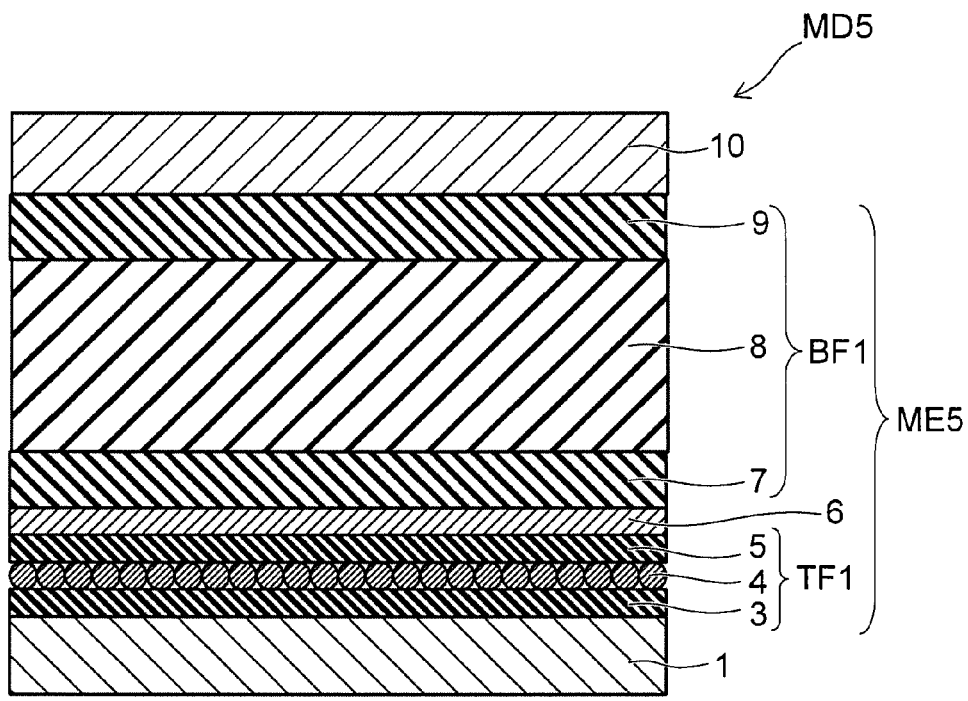
FIG. 20 is a cross-sectional view illustrating a memory device according to a fifth embodiment.

FIG. 20 is a cross-sectional view illustrating a memory device according to the embodiment.

Figure 21:
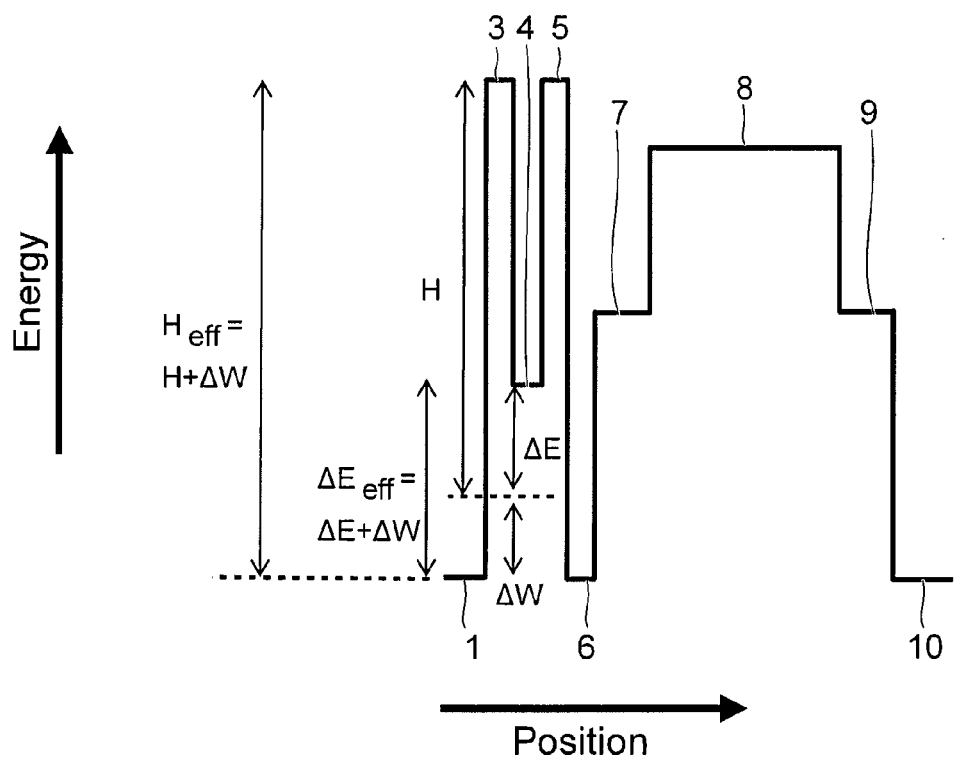
FIG. 21 is an energy structure diagram for the memory device according to the fifth embodiment.

FIG. 21 is an energy structure diagram for the memory device according to the embodiment.

As illustrated in FIG. 20, a memory device MD5 according to the embodiment differs from the memory device MD1 according to the first embodiment (see FIG. 1) described above in that the writing assist silicon layer 2 (see FIG. 1) is not provided.

As illustrated in FIG. 21, in the memory device MD5, unlike the first embodiment described above, no silicon layer as a buffer layer between the metal interconnection 1 and the interconnection-side tunnel oxide film 3 is provided. This configuration causes the electrons to be injected from the metal interconnection 1, where the energy is deeper, rather than from the silicon conduction band edge directly to the tunnel film TF1 during the writing operation and the reading operation. In this case, taking into consideration the energy difference ΔW between the silicon conduction band edge and the Fermi surface of the metal interconnection 1 as an effective barrier, the same operation as the first embodiment can be carried out. The energy difference ΔW corresponds to the difference between the electron affinity and the work function.

For example, if the height of the energy barrier between the silicon conduction band edge and the interconnection-side tunnel oxide film 3 is H, in order to inject electrons from the metal interconnection 1 to the interconnection-side tunnel oxide film 3, the height of the effective energy barrier $H_{\it{eff}}=H+\Delta W$ is required, and in order to inject electrons from the metal interconnection 1 to the silicon microcrystal layer 4, the effective energy barrier $\Delta E_{\it{eff}}=\Delta E+\Delta W$ is required with respect to the energy barrier ΔE of the silicon microcrystal layer 4. The same structural design and operational design as the first embodiment can be carried out by taking into consideration the effective energy barrier height $H_{\it{eff}}$ and the effective energy barrier $\Delta E_{\it{eff}}$.

In the embodiment, the metal interconnection 1, the metal accumulation part 6, and the metal interconnection 10 have deeper energy than the normal silicon conduction band, which can minimize a leakage of electrons accumulated in the metal accumulation part 6. Their energy depths are determined in accordance with, for example, the work function of the metal interconnection 1, so the depths can be controlled by selecting the material of the metal interconnection 1 or the like. Note that in the example illustrated in FIG. 21, the energy depths of the metal interconnection 1, the metal accumulation part 6, and the metal interconnection 10 are virtually the same, but they may be different. Note that if the energy depth of the metal interconnection 1 is too deep, the writing operation and the reading operation will be slower, so it is necessary to carry out the design taking into consideration the effective energy barrier height $H_{\it{eff}}$ and the effective energy barrier $\Delta E_{\it{eff}}$ as described above.

The configuration, manufacturing method, action, and effect of the embodiment other than those described above are the same as the first embodiment described above.

Sixth Embodiment

Next, a sixth embodiment will be described.

Figure 22:
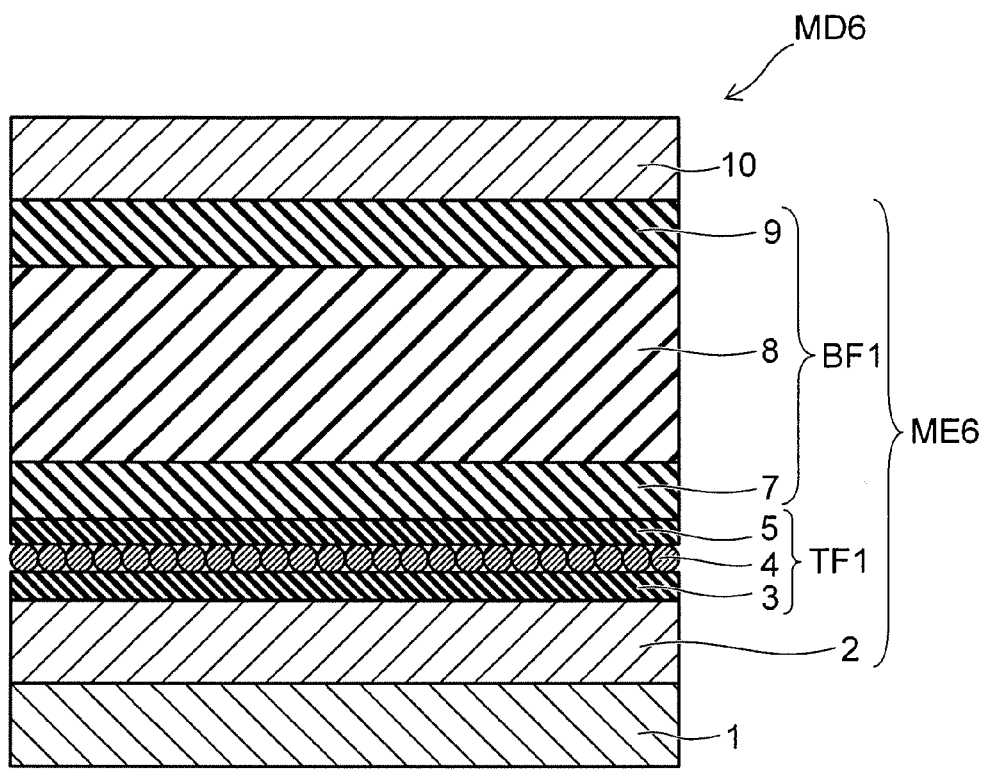
FIG. 22 is a cross-sectional view illustrating a memory device according to a sixth embodiment.

FIG. 22 is a cross-sectional view illustrating a memory device according to the embodiment.

Figure 23:
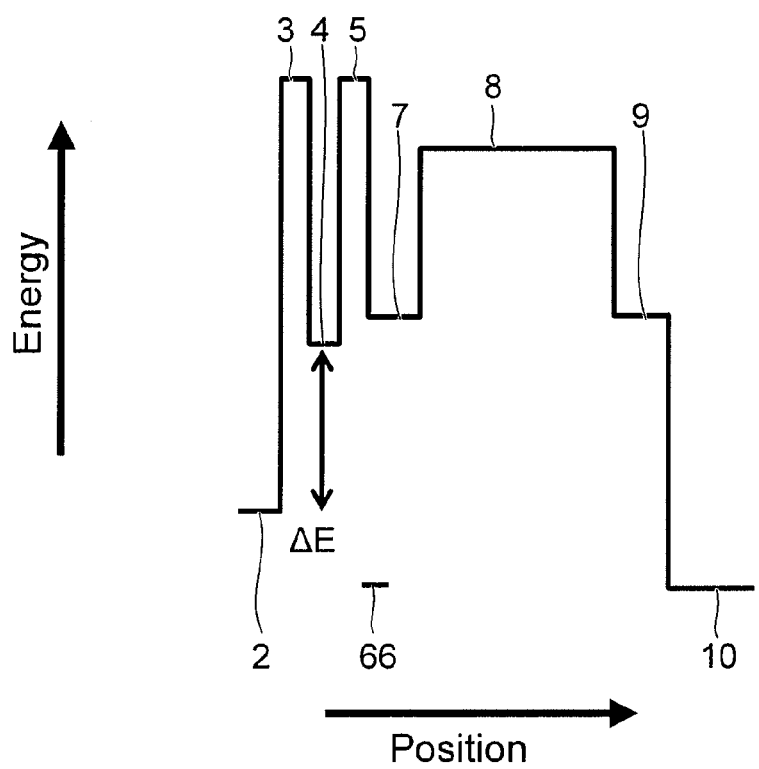
FIG. 23 is an energy structure diagram for the memory device according to the sixth embodiment.

FIG. 23 is an energy structure diagram for the memory device according to the embodiment.

As illustrated in FIG. 22, in a memory device MD6 according to the embodiment differs from the memory device MD1 (see FIG. 1) according to the first embodiment described above in that the metal accumulation part 6 (see FIG. 1) is not provided.

As illustrated in FIG. 23, in the memory device MD6, a trap level 66 in the hafnium oxide layer 7 with a thickness of 2 nm forms a charge storage portion. In the trap level 66 of the hafnium oxide layer 7, an atomic bond of the hafnium oxide is broken, in other words, a dangling bond or defect is generated, whose density can be controlled by the composition of the hafnium oxide layer 7, the film forming conditions, and the post-heating conditions.

In this case, the effective block film is formed by the portion from each trap level 66 in the hafnium oxide layer 7 to the interface between the hafnium oxide layer 7 and the aluminum oxide layer 8, the aluminum oxide layer 8, and the hafnium oxide layer 9. The energy structure of the block film BF1 has a convex shape, the same as the first embodiment described above. In this embodiment, the same action as the first embodiment can be achieved by only changing the energy of the charge storage portion from the metal Fermi level to the trap level.

Note that in the embodiment, an example has been described in which the trap levels 66 in the hafnium oxide layer 7 are the charge storage portion, but the insulating film that includes the trap levels is not limited to the hafnium oxide layer. For example, it may be a silicon nitride layer. In the first to fifth embodiments described above, it is considered that apart from the metal accumulation part 6, a certain quantity of charge is accumulated on traps in the hafnium oxide layer 7 or the silicon nitride layer 27. In these cases also, the effective block film is formed by the portion extending from each trap level in the hafnium oxide layer 7 or the silicon nitride layer 27 to the interface with the aluminum oxide layer 8, the aluminum oxide layer 8, and the hafnium oxide layer 9 or the silicon nitride film 29. In this case also, the energy structure of the block film is convex, so the same effect as the effect described above can be obtained.

Seventh Embodiment

Next, a seventh embodiment will be described.

Figure 24:
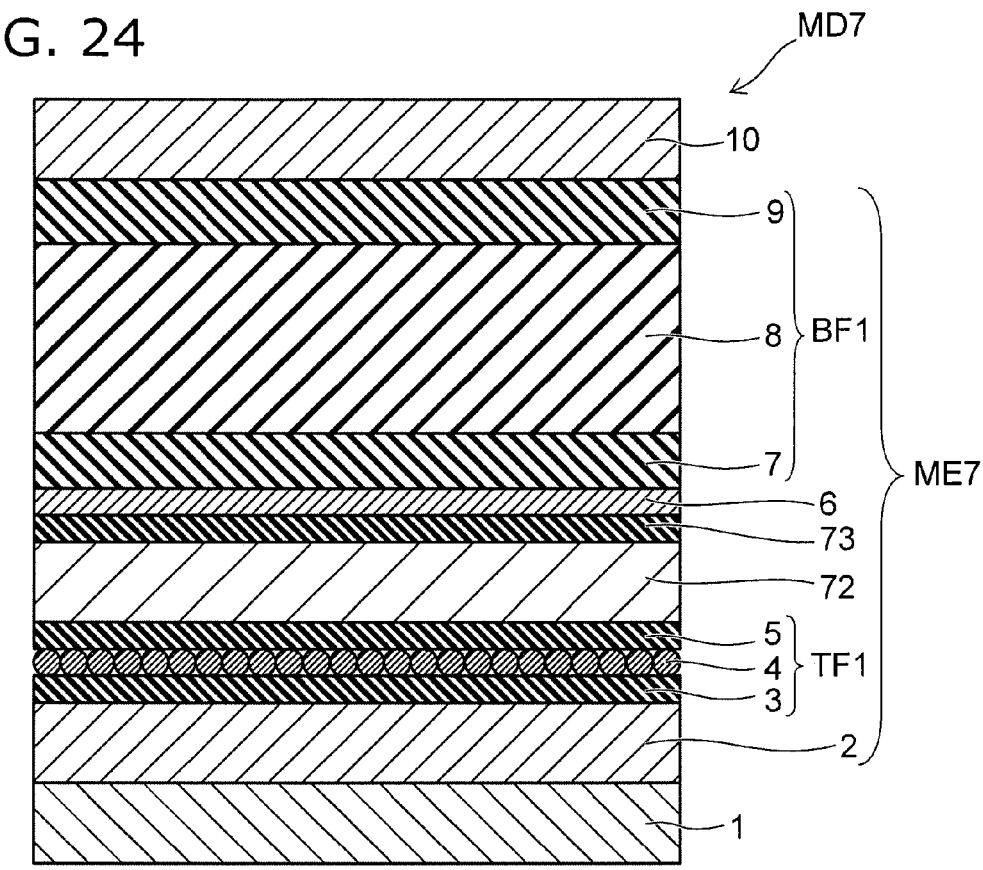
FIG. 24 is a cross-sectional view illustrating a memory device according to a seventh embodiment.

FIG. 24 is a cross-sectional view illustrating a memory device according to the embodiment.

Figure 25:
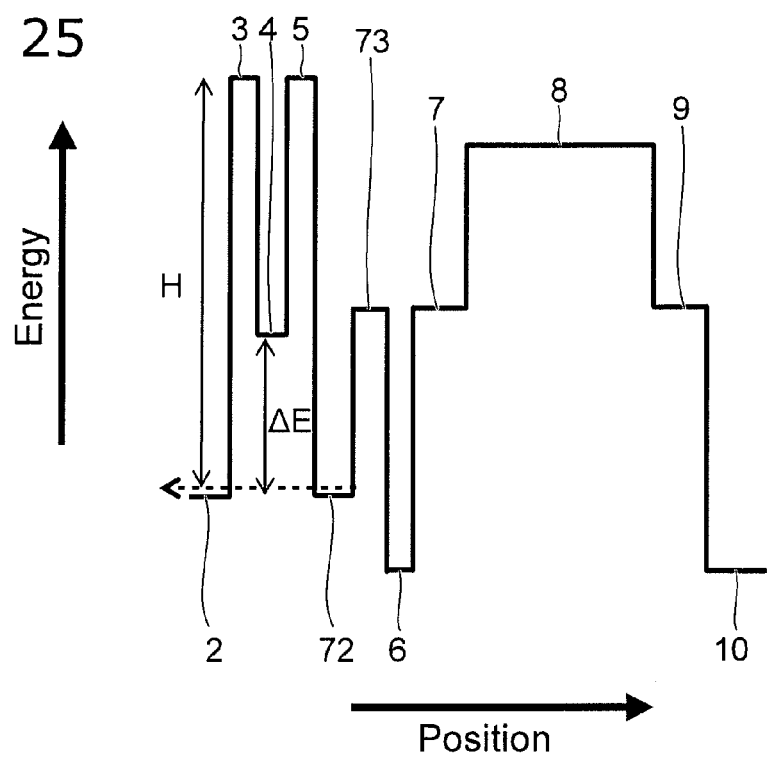
FIG. 25 is an energy structure diagram for the memory device according to the seventh embodiment.

FIG. 25 is an energy structure diagram for the memory device according to the embodiment.

As illustrated in FIG. 24, in a memory device MD7 according to the embodiment, in addition to the configuration of the memory device MD1 according to the first embodiment (see FIG. 1) described above, an erase assist silicon layer 72 with a thickness of, for example, 3 nm, and a silicon nitride layer 73 with a thickness of, for example, 1 nm are provided between the tunnel film TF1 and the metal accumulation part 6.

As illustrated in FIG. 25, the energy of the erase assist silicon layer 72 is the same as the energy of the writing assist silicon layer 2, and is the silicon conduction band edge. The energy of the silicon nitride layer 73 is higher than the energy of the erase assist silicon layer 72 and the energy of the metal accumulation part 6.

In the embodiment, the erase assist silicon layer 72 is provided as a buffer between the metal accumulation part 6 where energy is deep and the accumulation-side tunnel oxide film 5. Therefore, during the erase operation, the electrons accumulated in the metal accumulation part 6 temporarily move to the erase assist silicon layer 72, tunnel through the accumulation-side tunnel oxide film 5 from the erase assist silicon layer 72, pass through the silicon microcrystal layer 4, and tunnel through the interconnection-side tunnel oxide film 3.

Therefore, even when the Fermi level of the metal accumulation part 6 is deep, the erase tunnel current flows effectively, which allows the erase operation to be carried out at high speed.

Furthermore, in the embodiment, the silicon nitride layer 73 is provided between the metal accumulation part 6 and the erase assist silicon layer 72. This configuration causes the silicon nitride layer 73 to function as a diffusion prevention layer, which can minimize the inter-diffusion of the metal component included in the metal accumulation part 6 and the silicon included in the erase assist silicon layer 72. This makes it possible to minimize degradation of the metal accumulation part 6 which leads to a decrease in the energy depth and to a deterioration of the memory retention characteristics.

Eighth Embodiment

Next, an eighth embodiment will be described.

Figure 26:
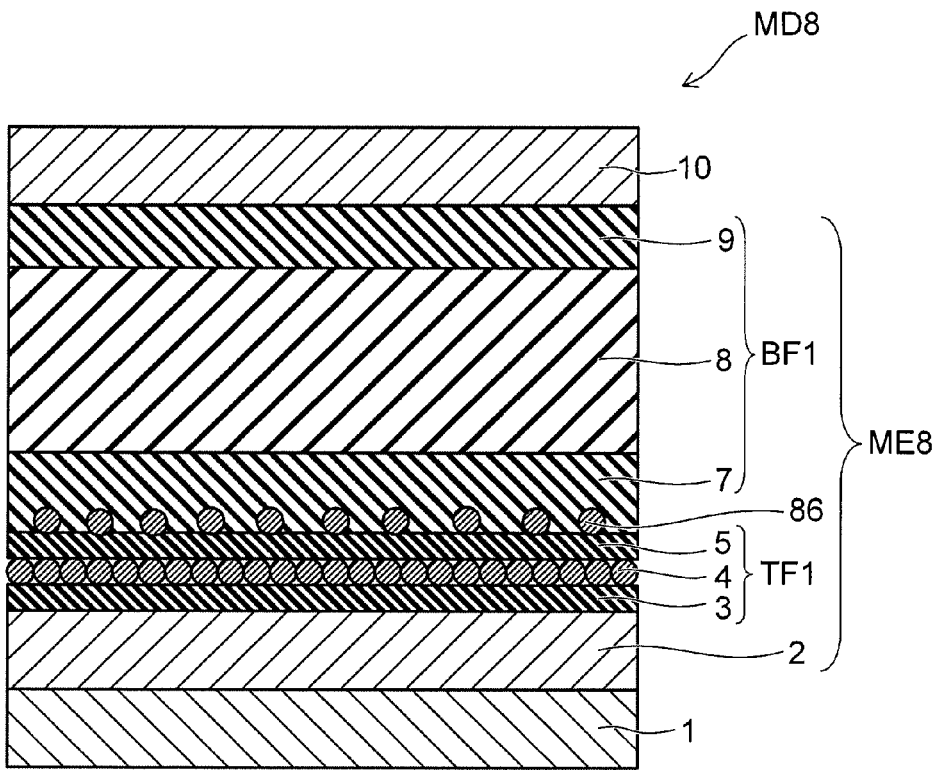
FIG. 26 is a cross-sectional view illustrating a memory device according to an eighth embodiment.

FIG. 26 is a cross-sectional view illustrating a memory device according to the embodiment.

As illustrated in FIG. 26, a memory device MD8 according to the embodiment differs from the memory device MD1 (see FIG. 1) according to the first embodiment described above in that instead of the metal accumulation part 6 (see FIG. 1), metal dots 86 are dispersively provided within the hafnium oxide layer 7. The metal dots 86 are made from, for example, ruthenium, with a diameter of, for example, 0.1 to 1 nm. The metal dots 86 are dispersively disposed within the portion of the hafnium oxide layer 7 in contact with the interface with accumulation-side tunnel oxide film 5.

In the memory device MD8, electrons are accumulated in the metal dots 86. The configuration, manufacturing method, action, and effect of the embodiment other than those described above are the same as the first embodiment described above.

Ninth Embodiment

Next a ninth embodiment will be described.

Figure 27:
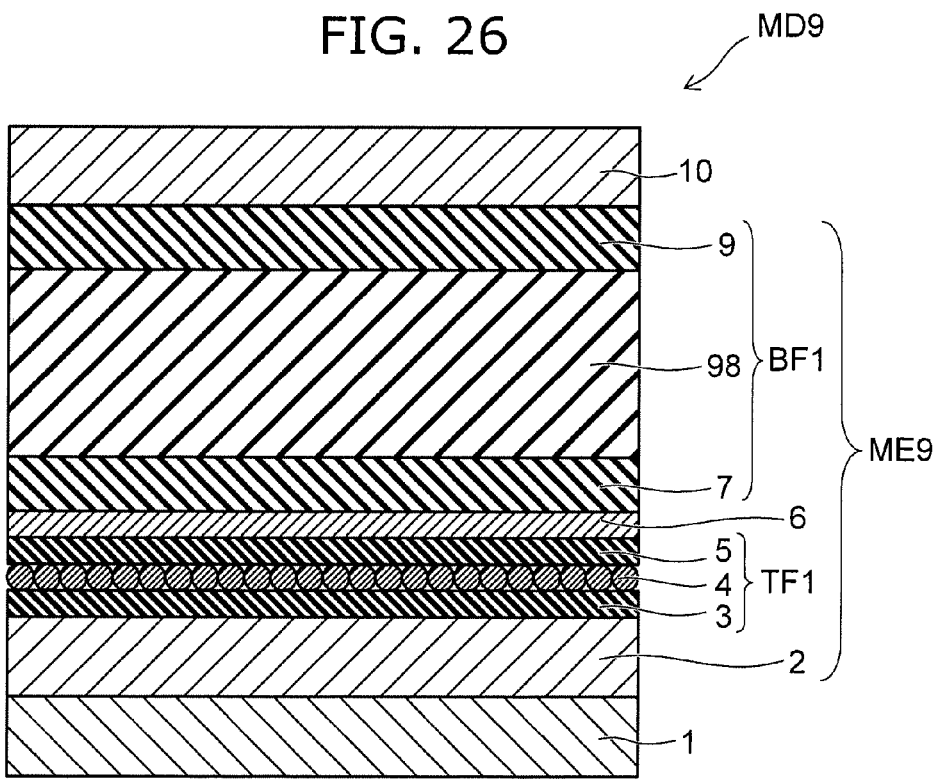
FIG. 27 is a cross-sectional view illustrating a memory device according to a ninth embodiment.

FIG. 27 is a cross-sectional view illustrating a memory device according to the embodiment.

As illustrated in FIG. 27, a memory device MD9 according to the embodiment differs from the memory device MD1 (see FIG. 1) according to the first embodiment described above in that instead of the aluminum oxide layer 8 (see FIG. 1), a lanthanum aluminosilicate (LaAlSiO) layer 98 with a thickness of, for example, 8 nm is provided. The energy of the lanthanum aluminosilicate layer 98 is higher than the energy of the hafnium oxide layer 7 and the energy of the hafnium oxide layer 9, so the energy structure of the block film BF9 is convex.

The configuration, manufacturing method, action, and effect of the embodiment other than those described above are the same as the first embodiment described above.

Tenth Embodiment

Next, a tenth embodiment will be described.

Figure 28:
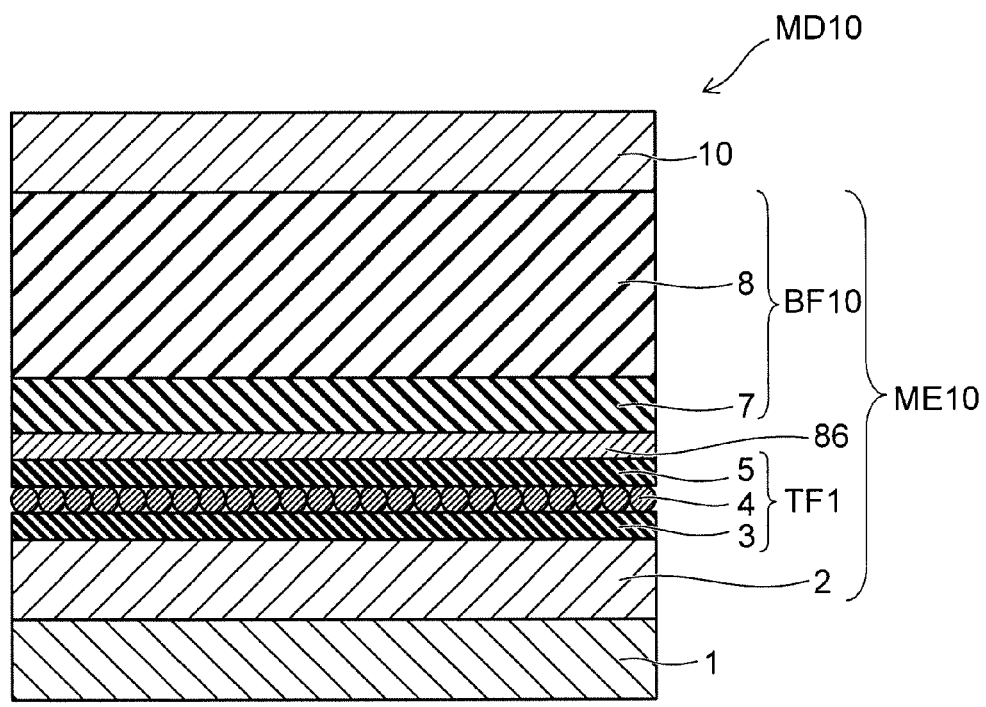
FIG. 28 is a cross-sectional view illustrating a memory device according to a tenth embodiment.

FIG. 28 is a cross-sectional view illustrating a memory device according to the embodiment.

Figure 29:
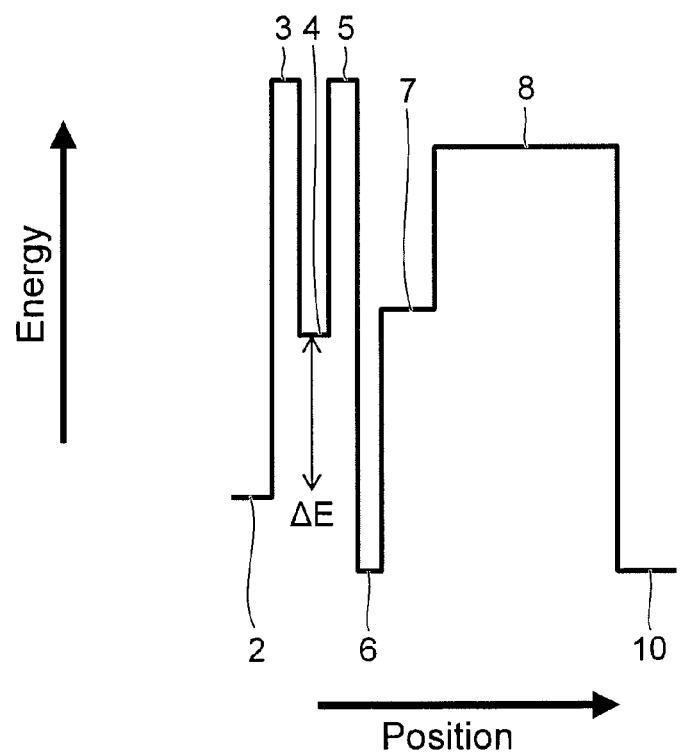
FIG. 29 is an energy structure diagram for the memory device according to the tenth embodiment.

FIG. 29 is an energy structure diagram for the memory device according to the embodiment.

As illustrated in FIG. 28, a memory device MD10 according to the embodiment differs from the memory device MD1 (see FIG. 1) according to the first embodiment in that the hafnium oxide layer 9 (see FIG. 1) is not provided.

As illustrated in FIG. 29, in the memory device MD10, the energy structure of the block film BF10 has a stairs shape that becomes higher with distance from the metal accumulation part 6. With the embodiment, although the width of the energy barrier to prevent back tunnel current is narrow compared with the first embodiment, provided the erase voltage is not excessive, this is not a problem in practice.

The configuration, manufacturing method, action, and effect of the embodiment other than those described above are the same as the first embodiment described above.

Eleventh Embodiment

Next an eleventh embodiment will be described.

This embodiment is an example in which the memory device as described in each of the embodiments described above is integrated in a three-dimensional manner.

Figure 30:
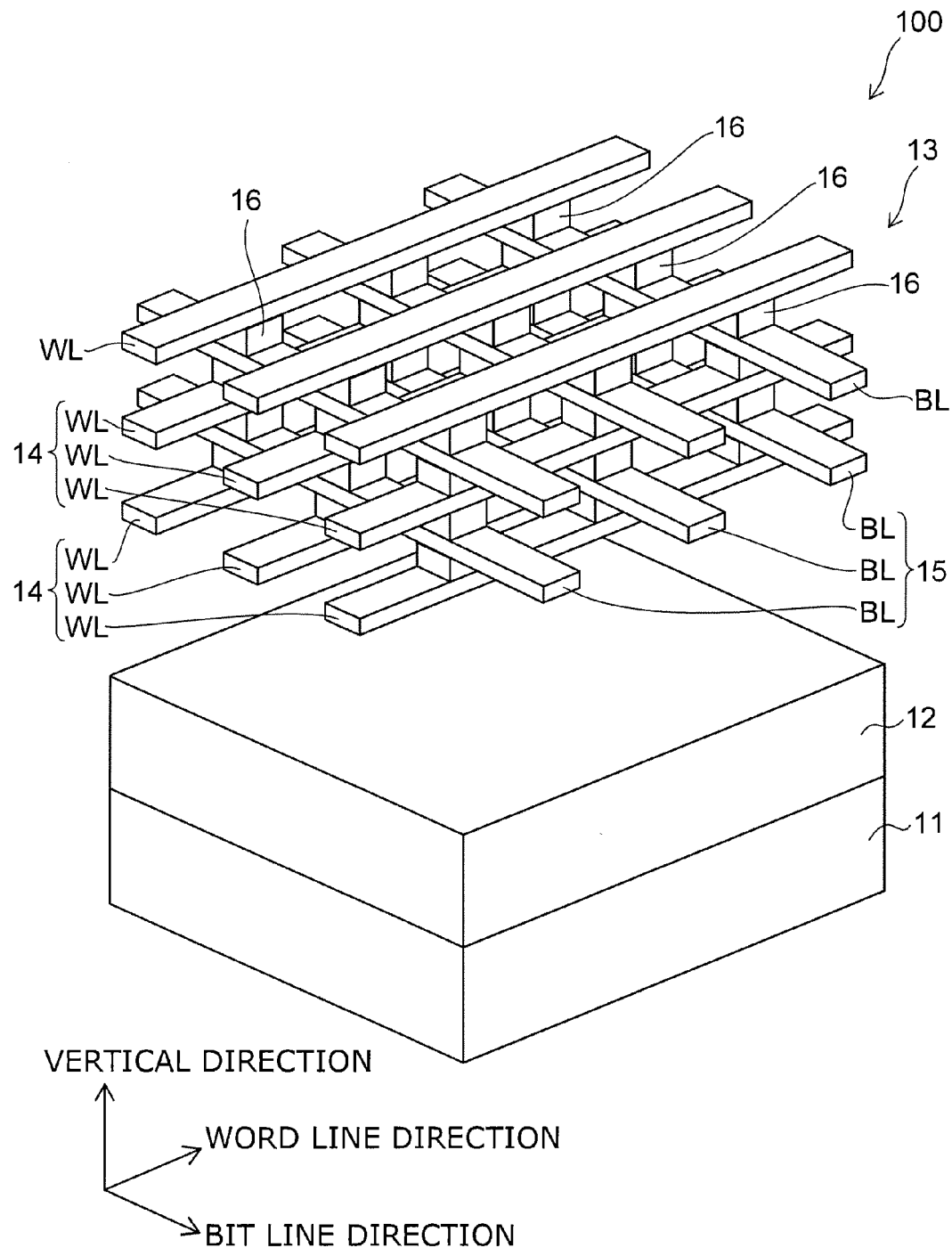
FIG. 30 is a perspective view illustrating an example of the memory device according to an eleventh embodiment.

FIG. 30 is a perspective view illustrating an example of the memory device according to the embodiment.

As illustrated in FIG. 30, in a memory device 100 according to the embodiment, a silicon substrate 11 is provided. A drive circuit (not illustrated) of the memory device 100 is formed on the top layer portion and top surface of the silicon substrate 11. An inter-layer insulating film 12 formed from, for example, silicon oxide is provided on the silicon substrate 11 so as to embed the drive circuit therein. A memory cell part 13 is provided on the inter-layer insulating film 12.

In the memory cell part 13, word line interconnect layers 14 that include a plurality of word lines WL extending in a direction parallel to the top surface of the silicon substrate 11 (hereafter referred to as the "word line direction") and bit line interconnect layers 15 that include a plurality of bit lines BL extending in a direction that is parallel to the top surface of the silicon substrate 11 and that intersects the word line direction at, for example, right angles (hereafter referred to as the "bit line direction") are stacked alternately. There is no contact between the word lines WL, between the bit lines BL, and between the word lines WL and the bit lines BL.

Pillars 16 extending in a direction normal to the top surface of the silicon substrate 11 (hereafter referred to as the "vertical direction") are provided at the points of closest proximity between each word line WL and each bit line BL. The shape of the pillars 16 is, for example, a circular column shape, a square column shape, or an approximately square column shape with the corners rounded. The pillars 16 are formed between the word lines WL and the bit lines BL, and each memory cell is constituted of a single pillar 16. In other words, the memory device 100 is a cross-point type device in which memory cells are disposed at each point of closest proximity between the word lines WL and the bit lines BL. An inter-layer insulating film (not illustrated) is embedded between the word lines WL, the bit lines BL, and the pillars 16.

Each of the pillars 16 is constituted of any of the memory elements including the memory elements ME1 to ME10 described in the first to tenth embodiments described above. In this case, the metal interconnection 1 is one of the word line WL and the bit line BL, and the metal interconnection 10 is the other of the word line WL and the bit line BL.

The embodiment makes it possible to integrate a large number of memory elements in a three-dimensional manner. In this way, it is possible to realize a memory device with a high density of memory cells.

(Common Matters)

Next, several conditions for obtaining a more significant effect in each of the embodiments described above will be described.

In each of the embodiments described above, the silicon microcrystal layer 4 is provided as a microcrystal layer provided in the tunnel film, but a conductive fine particulate layer made from other materials can form an energy barrier by confinement, and making the grain size smaller forms a large energy barrier ΔE. Thus, the same effect can be obtained.

In each of the embodiments described above, in conductive nano fine particulates such as silicon nano microcrystals in the tunnel film, the tunnel effect is used via the energy formed by confinement of carriers. In other words, within the energy range of the barrier ΔE within the conductive nano fine particulate, there is no quantum mechanical state, so when the passage of a carrier is blocked by ΔE such as when retaining memory, the fact that there is no option for passage other than energetically passing over the energy barrier ΔE is utilized. Therefore, a necessary condition for realizing the effect is that the energy level ΔE of the conductive nano fine particulate is greater than the thermal fluctuation $k_B T$ ($k_B$ is Boltzmann's constant, T is the absolute temperature, at room temperature $k_B T$ is about 26 meV), namely $\Delta E > k_B T$.

The barrier ΔE is determined by the Coulomb blockage energy when the conductive nano fine particulate is a metal material, and by the Coulomb blockage energy (electrostatic energy) and the quantum confinement energy when the conductive nano fine particulate is a semiconductor. The Coulomb blockage energy is one of the main factors of the ΔE, and when the conductive nano particles are a spherical or near spherical shape, if the particle diameter is d, the self-capacitance of the conductive nano fine particulates is Cself=$2\pi \in d$, so an indicative value of Coulomb energy per electron is about q/Cself=$q/(2\pi \in d)$. Here q is the elementary charge, and ∈ is the dielectric constant of the tunnel insulating film material. In particular, the electrostatic energy of the first electron to enter the conductive nano fine particulate is q/(2Cself)=$q/(4\pi \in d)$.

For example, using this, it is possible to estimate the preferred range of the size d of the conductive nano fine particulate. It is desirable that the grain size of the conductive fine particulate is $q/(4\pi \in d) > k_B T$, in other words, d<dmax=$q/(4\pi \in k_B T)$. In the case of a typical tunnel film that is a silicon oxide film, dmax=15 nm. In the invention, the grain size is 1.5 nm, so the condition that the energy ΔE required for a charge of one electron in the conductive fine particulate is higher than the room temperature $k_B T$ is sufficiently satisfied.

The leakage of electrons in the state that electrons have been retained in the metal accumulation part 6 is minimized by blockage by the ΔE. Therefore, unless the ΔE is higher to some extent than the room temperature change $k_B T$, degradation of memory retention due to thermal fluctuations cannot be sufficiently minimized. It is desirable that ΔE is at least five times the room temperature change $k_B T$, in other words, $\Delta E \geq 5 \times k_B T$ is satisfied. If $\Delta E = q/(4\pi \in d)$ (electrostatic energy per electron), and if the tunnel film is silicon oxide film, d≤3 nm is desirable.

In each of the embodiments described above, the conductive particulate layer, such as the silicon microcrystal layer 4, is only provided on the tunnel side, allowing for a high energy state with no restriction from the block side, which makes the memory retention characteristics excellent. The upper limit of ΔE can be determined from the strength of the electric field during the reading operation. As illustrated in FIG. 5A, during reading in the LRS, it is desirable that the electrons pass without being affected by the ΔE in the tunnel film to generate a large reading current so that the current can be detected with a sense amplifier at the required speed. If the reading electric field is Fread, and the film thickness of the interconnection-side tunnel oxide film 3 is Tox3, then if Fread≥ΔE/Tox3, a large reading current can be realized when the electrons pass without being affected by the ΔE. On the other hand, it is desirable that the electric field applied to the tunnel oxide film be 15 MV/cm or less in order to prevent degradation of the film quality. Therefore, it is desirable that the upper limit of ΔE be 15 MV/cm≥ΔE/Tox3.

The energy barrier ΔE and grain size d in the above theory has a distribution due to variation in the grain size, in the case that a plurality of conductive nano fine particulates is formed. Therefore, the condition under which an effect is expected in the case that there is a plurality of nano fine particulates in the conductive nano fine particulate layer is an average value of the ΔE and the grain size d.

Furthermore, in the above theory, the grain size d of the conductive nano fine particulate is assumed to be the diameter of a sphere or a shape close to a sphere, but the actual shape of the conductive nano fine particulate is not necessarily nearly a strict spherical shape. The self-capacitance Cself for the diameter d of a spherical shape is Cself=$2\pi \in d$, and therefore the Coulomb blockade energy is given by approximately q/(2Cself)=$q/(4\pi \in d)$. In the case that the shape of the conductive nano fine particulate is not close to that of a sphere, an effective grain size d can be determined from d=Cself/$(2\pi \in)$ for the self-capacitance determined in accordance with the conductor shape.

In the above theory, the dependence of the energy barrier on the grain size is indicatively related to the Coulomb energy of the first electron on the conductive fine particulate, but in addition in the case of semiconductor fine particulate such as silicon microcrystals, quantum confinement also contributes to the energy barrier. The quantum confinement energy in the ground state can be estimated as approximately $h^2/(8m_{eff} d^2)$ in the case of one direction. Here, h is Planck's constant, and $m_{eff}$ is the effective mass of quantum confinement. In contrast to Coulomb electrostatic energy which varies as 1/d, quantum confinement varies as $1/d^2$, so as the particulates become smaller, the potential for quantum confinement increases.

Therefore, if the energy barrier ΔE is the quantum confinement energy in the ground state in three directions, from the equation $$\Delta E = (1/m_{eff\_x} + 1/m_{eff\_y} + 1/m_{eff\_z}) \times h^2/(8d^2),$$

the preferred grain size condition can be estimated. Here, $m_{eff\_x}$, $m_{eff\_y}$, and $m_{eff\_z}$ are the effective mass in the X-direction, the Y-direction, and the Z-direction, which are determined by the band structure of the fine particulate semiconductor material.

Alternatively, taking both Coulomb electrostatic energy and quantum confinement into consideration, from the equation $$\Delta E = q/(4\pi \in d) + (1/m_{eff\_x} + 1/m_{eff\_y} + 1/m_{eff\_z}) \times h^2/(8d^2),$$

the preferred grain size condition can be estimated. The above equations for the dependence on the grain size due to Coulomb energy and quantum confinement energy are each an approximation equation that assumes a single conductive fine particulate, but it enables an indicative estimate of the grain size for a desired ΔE.

In the memory devices according to each of the embodiments described above, the memory operation is enabled if there is at least one silicon microcrystal in the silicon microcrystal layer 4. Therefore, it is considered that it is possible to scale down to a cell size of 1 nm or less.

In each of the embodiments described above, examples have been described in which the silicon microcrystal layer is formed by a microcrystal layer that is produced by heating a thin film of amorphous silicon, but other methods can be considered such as directly forming the silicon microcrystals by LPCVD at high temperature.

In each of the embodiments described above, it is preferable that the interconnection-side tunnel oxide film 3 and the accumulation-side tunnel oxide film 5 be as thin as possible. This is because increasing the energy barrier by reducing the size of the silicon microcrystals of the silicon microcrystal layer 4 allows the memory retention characteristics to be improved, so making the interconnection-side tunnel oxide film 3 and the accumulation-side tunnel oxide film 5 thinner allows for a larger reading current. If the thickness is 2 nm or less at which the resistance of the oxide film itself is low, a significant effect can be expected. If the thickness is 1.5 nm or less, the resistance of the oxide film itself will be lower, which is more preferable. The lower limit can be 0.3 nm from the interatomic distance, or 0.7 nm from the heat of a natural oxide film in the atmosphere. Furthermore, in each of the embodiments described above, the material of the interconnection-side tunnel oxide film 3 and the accumulation-side tunnel oxide film 5 is a silicon oxide, but other insulating materials may be used.

In each of the embodiments described above, it is necessary that the metal accumulation part 6 and the trap levels 66 can accumulate charge. Metal materials other than ruthenium and trap insulating materials other than hafnium oxide as described here may be used. Metal materials other than ruthenium include TiN, TaN, and the like. Trap insulating materials other than hafnium oxides ($HfO_x$) include silicon nitride, $HfSiO_x$ that includes 30% or less Si in $HfO_x$, or, Si-rich silicon nitride.

However, in each of the embodiments described above, it is necessary to not only accumulate charge but also prevent erroneous writing in reading operation in the erased state as illustrated in FIG. 5A. It is preferable that erroneous writing even in the written state be reduced as illustrated in FIG. 5B. In other words, it is required that the metal accumulation part 6 or the trap levels 66 do not capture tunnel electrons passing at high energy.

A three-terminal charge accumulation cell such as a normal NAND flash memory is designed so that as many as possible of the tunnel electrons injected into the accumulation part are trapped by the accumulation part, and the current flowing through the block film is always reduced as much as possible. However in each of the embodiments described above, it is necessary that as large a current as possible passes through the accumulation part and the block film, without writing to the accumulation part during the reading operation. Therefore, if the structure that is suitable for a three-terminal charge accumulation cell is applied as it is, operations in each of the embodiments described above would be difficult.

For the accumulation part, instead of the charge storage portion suitable for a three terminal cell, preferably one with low trapping and accumulation capability is used, so that high energy tunnel electrons are not trapped and accumulated during reading. In order to minimize trapping and accumulation of electrons by the metal accumulation part 6 during reading, it is preferable that the quantity of metal be minute. In this case, as in the eighth embodiment illustrated in FIG. 26, the trapping efficiency may be adjusted by using minute metal dots 86 distributed in a dispersed manner as the metal accumulation part. Regarding the portion on the metal accumulation part side of the block film, which may contribute to trapping and accumulation, in other words, the hafnium oxide layer 7 or the silicon nitride layer 27, it is known from writing tests on MONOS structures for NAND three terminal cells and the like, that when the thickness of a layer whose main component is hafnium oxide is 2 nm or less, and the thickness of a layer whose main component is silicon nitride is 3 nm or less, the number of passing electrons starts to increase without being sufficiently trapped and accumulated. Therefore, in order to prevent erroneous writing during reading, it is preferable that, for a layer whose main component is hafnium oxide, the thickness be 2 nm or less, and that, for a layer whose main component is silicon nitride, the thickness be 3 nm or less.

As illustrated in FIG. 4, the writing operation is enabled because tunnel electrons are blocked by the block film and lower energy of the metal accumulation part 6 tends to cause electrons to be trapped by energy relaxation. Furthermore, as illustrated in FIG. 7, using the exponential variation of current with linear variation of voltage, a large ON/OFF ratio for LRS/HRS can be obtained with a small quantity of charge.

The structure of the block film does not have a concave shape in which energy of the middle portion is lower than energy of both sides. For example, it is preferable that the energy structure be convex, as in each of the embodiments described above. A material with a high energy barrier and high block capability with few traps is preferable as the material of the block film, and besides silicon oxide and alumina, lanthanum oxide which includes lanthanum (La), and, lanthanum aluminosilicate (LaAlSiO) as illustrated in FIG. 27 may be used. With lanthanum aluminosilicate, the dielectric constant is higher than alumina, and the heat resistance and resistance to hydrofluoric acid dissolution can be increased compared with lanthanum oxide.

In the first and second embodiments, the alumina that constitutes the highest energy barrier within the block film structure has a lower energy barrier then the silicon oxide film that constitutes the tunnel film structure. In other words, as illustrated in FIG. 2, $H_B$<H. On the other hand, in the third and fourth embodiments, the silicon oxide layer 38 that constitutes the highest energy barrier within the block film structure has the same energy barrier height as the silicon oxide film that constitutes the tunnel film structure. As illustrated in FIG. 5A, it is considered to be advantageous to have the highest energy barrier of the block film lower than the barrier of the tunnel insulating film, as in the first and second embodiments, in order to minimize erroneous writing during writing in a state where the block film barrier does not block.

In the block film, by providing, on the accumulation side of the film with the highest energy barrier, a film with a lower energy barrier, as illustrated in FIG. 5A, it is easier to design so that during the writing operation there is no blockage by the energy of the block film, so erroneous writing during reading can be effectively prevented. Hafnium oxide, hafnium silicate including a small quantity (30% or less) of silicon ($HfSiO_x$), silicon nitride, and the like can be used as the material of the low barrier film disposed on the accumulation part side in the block film. These films include traps therein, so they can be used for adjusting the trapping and accumulation.

In the block film, on the metal interconnection 10 side of the film with the highest energy barrier, a film with a lower energy barrier is disposed, so degradation of the blocking capability of the film with the highest energy barrier due to diffusion of the metal atoms of the metal interconnection 10 can be prevented, while minimizing the leakage current. Hafnium oxide, hafnium silicate including a small quantity (30% or less) of silicon ($HfSiO_x$), silicon nitride, and the like can be used as the material of the low barrier film on the metal interconnection 10 side.

Besides, tungsten (W), tungsten nitride (WN), tantalum nitride (TaN), tungsten silicide (WSi), cobalt silicide (CoSi), nickel silicide (NiSi) and copper (Cu) can be used as the material of the metal interconnections 1 and 10. Furthermore, a stacked film in which a plurality of layers of these materials are stacked may be used as the metal interconnections 1 and 10. If a resistance higher than that of metals is permissible, a semiconductor material such as $n^+$-type silicon may be used to form the interconnection. In the case of $n^+$-type silicon interconnection, the energy of the interconnection is the silicon conduction band edge, and the electrons are injected into the tunnel film from the silicon conduction band edge, so the writing assist silicon layer 2 is not necessary.

In each of the embodiments described above, as illustrated in FIG. 5A, in the reading operation in the erased state, the electrons injected from the interconnection side are not blocked by the barrier of the block film. If the dielectric constant of the silicon oxide film is $\in ox$, the physical film thickness is Tp, the effective oxide film thickness of the insulating film of dielectric constant $\in$ is T, then $T = \in Tp / \in ox$.

If the effective oxide film thickness of the interconnection-side tunnel oxide film 3, the accumulation-side tunnel oxide film 5, the hafnium oxide layer 7, the aluminum oxide layer 8, and the hafnium oxide layer 9 are respectively $T_3$, $T_5$, $T_7$, $T_8$, and $T_9$, the reading voltage is Vread, and the barrier height viewed from the energy level of the electrons injected from the highest barrier block film, for example the interconnection side of the aluminum oxide layer 8 (the Si conduction band edge in FIG. 5A) is $H_B$, then the condition that the electrons injected from the metal interconnection 1 side in the reading operation in the erased state are blocked by the block film barrier is $$q \times V\text{read} \times (T_3 + T_5 + T_7)/(T_3 + T_5 + T_7 + T_8 + T_9) \geq H_B.$$

Where q is the elementary charge. The physical film thickness can be determined from the cross-sectional structure, the dielectric constant and the height of the energy barrier from the material used, and the operating voltage by analyzing the peripheral circuits.

The accumulated charge in the erased state (LRS) is not necessarily 0. More accurately, if the areal density of the number of electrons accumulated in the metal accumulation part 6 in the erased state (LRS) is Ne, then $$q \times V\text{read} \times (T_3 + T_5 + T_7)/(T_3 + T_5 + T_7 + T_8 + T_9) \geq HB + q^2 \times Ne \times (T_3 + T_5) \times (T_8 + T_9)/[\in ox \times (T_3 + T_5 + T_7 + T_8 + T_9)].$$

However, if the quantity of accumulated charge in the LRS is increased, the quantity of accumulated charge in the HRS is increased accordingly, so the charge retention characteristics are degraded. Alternatively, if there is a large accumulated negative charge in the LRS, the hole tunnel current is increased during writing and erasing, so the tunnel film is degraded. Therefore, it is considered desirable that the accumulated charge in the LRS is close to 0.

In addition, in each of the embodiments described above, as illustrated in FIG. 5B, in the state in which charge is written, during the reading operation, it is preferable that the electrons injected from the metal interconnection 1 be not blocked by the barrier of the block film. In the written state in which electrons are accumulated in the metal accumulation part 6, if the areal density of the number of accumulated electrons is Nw, then $$q \times V\text{read} \times (T_3 + T_5 + T_7)/(T_3 + T_5 + T_7 + T_8 + T_9) \geq H_B + q^2 \times Nw \times (T_3 + T_5) \times (T_8 + T_9)/[\in ox \times (T_3 + T_5 + T_7 + T_8 + T_9)].$$

The preferred areal density of the number of electrons Nw can be estimated from the ON/OFF ratio between the LRS and the HRS. As illustrated in FIG. 5A and FIG. 5B, the magnitude of the reading current depends exponentially on the height of the barrier $\Delta E$ relative to the energy of the injected electrons (the silicon conduction band edge in FIG. 5A). Therefore, the reading current in the HRS is reduced by orders of magnitude relative to the reading current in the LRS. The height of the effective $\Delta E$ varies with the electric field F applied to the tunnel film as $\Delta E - F \times T_3$. Therefore, from statistical mechanics, the current flowing passing over $\Delta E$ is proportional to $\exp[-(\Delta E - F \times T_3/k_B T)]$. Therefore, the current varies with the tunnel electric field F by $\exp[F \times T_3/k_B T]$. Assuming that room temperature T=300 K, a change in $F \times T_3$ of 60 meV causes a change of one order of magnitude.

Assuming that the sufficiently desirable ON/OFF ratio for memory operation is 3 orders of magnitude, the variation of the tunnel electric field F due to the areal density of the number of electrons in the accumulated charge Nw is $$-q \times Nw \times (T_7 + T_8 + T_9)/[\in ox \times (T_3 + T_5 + T_7 + T_8 + T_9)].$$

Therefore, $$T_3 \times q \times Nw \times (T_7 + T_8 + T_9)/[\in ox \times (T_3 + T_5 + T_7 + T_8 + T_9)] \geq 3 \times 60 \text{ mV}.$$

In other words, $$Nw \geq 0.18 \text{ V} \times \in ox \times (T_3 + T_5 + T_7 + T_8 + T_9)/[T_3 \times q \times (T_7 + T_8 + T_9)]$$

is the desirable range of Nw. Therefore, the condition that during reading in the writing state the electrons injected from the interconnection side are not blocked by the block film barrier is $$q \times V\text{read} \times (T_3 + T_5 + T_7)/(T_3 + T_5 + T_7 + T_8 + T_9) \geq H_B + q \times 0.18 \text{ V} \times (T_3 + T_5) \times (T_8 + T_9)/[T_3 \times (T_7 + T_8 T_9)].$$

In each of the embodiments described above, as illustrated in FIG. 3, during the writing operation, it is preferable that the electrons injected from the metal interconnection 1 be blocked by the barrier of the block film, which can improve the writing efficiency. If the writing voltage is Vwrite, then the following equation can be written:

$$q \times V\text{write} \times (T_3 + T_5 + T_7)/(T_3 + T_5 + T_7 + T_8 + T_9) < H_B.$$

The operating voltage can be determined by analysis of the peripheral circuits.

If the effective oxide film thicknesses of the overall tunnel film structure, the overall block film structure, the interconnection-side tunnel insulating film 3, and the accumulation-side block film (hafnium oxide film or silicon nitride layer 27) are T, $T_B$, $T_3$, and $T_7$, respectively, the above conditions can be written as follows.

The condition that the injected electrons are not blocked by the block film barrier when reading in the erased state is $$q \times V\text{read} \times (T + T_7)/(T + T_B) \geq H_B.$$

The condition that the injected electrons are not blocked by the block film barrier in the written state is $$q \times V\text{read} \times (T + T_7)/(T + T_B) \geq H_B q \times 0.18 \text{ V} \times T \times (T_B - T_7)/[T_3 \times T_B].$$

The condition that the injected electrons are blocked by the block film barrier in the written state is $$q \times V\text{write} \times (T + T_7)/(T + T_B) < H_B.$$

In each of the embodiments described above, the energy structure of the block film is convex, and has no concave structure in which energy of the middle portion is lower than energy of both sides, so it is easy to minimize erroneous writing. As illustrated in FIG. 28 and FIG. 29, even when there is no low barrier layer (hafnium oxide layer 9) on the metal interconnection 10 side of the block film, when the effective oxide thicknesses of the overall tunnel structure, the overall block film structure, the interconnection-side tunnel insulating film, and the accumulation-side block film are T, $T_B$, $T_3$, and $T_7$, respectively, if the above equation is satisfied as described above, the same reading and writing control can be obtained. However, frequently, metal with low wiring resistance and that can effectively prevent back tunneling during the erase operation is used, so it is necessary to avoid increasing the leakage current caused by diffusion of metal into the high barrier block film (the aluminum oxide layer 8), so it is considered that a convex structure having a low barrier layer (hafnium oxide layer 9 or silicon nitride layer 29) on the metal interconnection 10 side is excellent. According to the embodiments described above, it is possible to realize a memory device with stable characteristics and a method for manufacturing the memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device comprising:
   a first interconnection;
   a second interconnection;
   a charge storage portion provided between the first interconnection and the second interconnection, the charge storage portion being capable of accumulating an electron;
   a tunnel film provided between the first interconnection and the charge storage portion, the tunnel film including:
   a fine particulate layer including conductive fine particulates satisfying the Coulomb blockade condition,
   a first tunnel insulating layer provided between the first interconnection and the fine particulate layer, and
   a second tunnel insulating layer provided between the fine particulate layer and the charge storage portion; and
   a block film provided between the charge storage portion and the second interconnection, the block film having an energy structure in which no concave portion with an energy barrier lower than energy barriers on both sides thereof is present.

2. The memory device according to claim 1, wherein the block film includes
   a first insulating layer,
   a second insulating layer disposed between the charge storage portion and the first insulating layer, and
   a third insulating layer disposed between the first insulating layer and the second interconnection, and
   energy of the first insulating layer is higher than energy of the second insulating layer and energy of the third insulating layer.

3. The memory device according to claim 1, further comprising a semiconductor layer provided between the first interconnection and the tunnel film, energy of the semiconductor layer being higher than energy of the first interconnection.

4. The memory device according to claim 1, wherein
   a writing operation is carried out by applying a writing voltage between the first interconnection and the second interconnection to allow electrons to tunnel through the tunnel film and to cause the electrons to be blocked by the block film, and
   a reading operation is carried out by applying a reading voltage between the first interconnection and the second interconnection to allow electrons that have tunneled through the tunnel film to pass through the block film, the reading voltage having the same polarity as the writing voltage and being higher than the writing voltage.

5. The memory device according to claim 1, wherein
   in an erased state in which electrons have been removed from the charge storage portion, when a reading voltage is applied, electrons that have passed through the tunnel film have energy that is higher than the highest energy barrier in the block film.

6. The memory device according to claim 1, wherein the block film includes
   a first insulating layer, and
   a second insulating layer disposed between the charge storage portion and the first insulating layer, energy of the second insulating layer being lower than energy of the first insulating layer, and
   when an effective oxide film thickness of the overall tunnel film is T, an effective oxide film thickness of the overall block film is $T_B$, an effective oxide film thickness of the second insulating layer is $T_7$, an energy barrier of the first insulating layer is $H_B$, an elementary charge is q, and a reading voltage is Vread, the following expression is satisfied:

$$q \times V\text{read} \times (T+T_7)/(T+T_B) \geq H_B.$$

7. The memory device according to claim 1, wherein when a writing voltage is applied, energy of electrons that have passed through the tunnel film is lower than the highest energy barrier in the block film.

8. The memory device according to claim 1, wherein the block film includes
   a first insulating layer, and
   a second insulating layer disposed between the charge storage portion and the first insulating layer, energy of the second insulating layer being lower than energy of the first insulating layer, and
   when an effective oxide film thickness of the overall tunnel film is T, an effective oxide film thickness of the overall block film is $T_B$, an effective oxide film thickness of the second insulating layer is $T_7$, an energy barrier of the first insulating layer is $H_B$, an elementary charge is q, and a writing voltage is Vwrite, the following expression is satisfied:

$$q \times V\text{write} \times (T+T_7)/(T+T_B) < H_B.$$

9. The memory device according to claim 1, wherein in a written state in which electrons have been accumulated in the charge storage portion, when a reading voltage is applied, energy of electrons that have passed through the tunnel film is higher than the highest energy barrier in the block film.

10. The memory device according to claim 1, wherein the block film includes
    a first insulating layer, and
    a second insulating layer disposed between the charge storage portion and the first insulating layer, energy of the second insulating layer being lower than energy of the first insulating layer, and
when an effective oxide film thickness of the overall tunnel film is T, an effective oxide film thickness of the overall block film is $T_B$, an effective oxide film thickness of the first tunnel insulating layer is $T_3$, an effective oxide film thickness of the second insulating layer is $T_7$, an energy barrier of the first insulating layer is $H_B$, an elementary charge is q, and a reading voltage is Vread, the following expression is satisfied:

$$q \times Vread \times (T+T_7)/(T+T_B) \geq H_B + q \times 0.18 \ V \times T \times (T_B-T_7)/[T_3 \times T_B].$$

11. The memory device according to claim 1, wherein the highest energy barrier in the tunnel film is higher than the highest energy barrier in the block film.

12. The memory device according to claim 1, wherein when electrostatic energy of one electron on the conductive fine particulate is ΔE, an elementary charge is q, and an effective oxide film thickness of the first tunnel insulating layer is $T_3$, the following expression is satisfied:

$$q \times 15 \ MV/cm \times T_3 \geq \Delta E \geq 5 \times 26 \ meV.$$

13. The memory device according to claim 1, wherein the conductive fine particulate is silicon microcrystal having a grain size of 3 nm or less.

14. The memory device according to claim 1, wherein the first tunnel insulating layer is a silicon oxide layer having a thickness of 2 nm or less, and
the second tunnel insulating layer is a silicon oxide layer having a thickness of 2 nm or less.

15. The memory device according to claim 1, wherein the charge storage portion is a continuous film made from metal, or, includes a plurality of metal dots disposed in a dispersed manner.

16. The memory device according to claim 1, wherein the charge storage portion includes a dangling bond or a trap level formed by a defect.

17. The memory device according to claim 1, wherein the block film includes
    a first insulating layer, and
    a second insulating layer disposed between the charge storage portion and the first insulating layer, energy of the second insulating layer being lower than energy of the first insulating layer, and
the second insulating layer includes hafnium oxide, hafnium silicate with a silicon concentration of 30% or less, or silicon nitride.

18. The memory device according to claim 1, wherein the block film includes
    a first insulating layer, and
    a second insulating layer disposed between the charge storage portion and the first insulating layer, energy of the second insulating layer being lower than energy of the first insulating layer, and
the second insulating layer is a hafnium oxide layer having a physical film thickness of 2 nm or less, a hafnium silicate layer having a physical film thickness of 2 nm or less, or a silicon nitride layer having a physical film thickness of 3 nm or less.

19. The memory device according to claim 1, wherein the block film includes
    a first insulating layer, and
    a second insulating layer disposed between the charge storage portion and the first insulating layer, energy of the second insulating layer being lower than energy of the first insulating layer, and
the first insulating layer includes silicon oxide, aluminum oxide, lanthanum oxide, or lanthanum aluminum silicate.

20. The memory device according to claim 1, further comprising a semiconductor layer provided between the tunnel film and the charge storage portion, energy of the semiconductor layer being higher than energy of the charge storage portion.

* * * * *